(12) United States Patent
Chu et al.

(10) Patent No.: US 11,631,736 B2
(45) Date of Patent: Apr. 18, 2023

(54) EPITAXIAL SOURCE/DRAIN FEATURE WITH ENLARGED LOWER SECTION INTERFACING WITH BACKSIDE VIA

(71) Applicant: Taiwan Semiconductor Manufacturing Co., Ltd., Hsin-Chu (TW)

(72) Inventors: Feng-Ching Chu, Hsinchu (TW); Wei-Yang Lee, Taipei (TW); Chia-Pin Lin, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 173 days.

(21) Appl. No.: 16/901,631

(22) Filed: Jun. 15, 2020

(65) Prior Publication Data

US 2021/0391421 A1 Dec. 16, 2021

(51) Int. Cl.
*H01L 21/768* (2006.01)
*H01L 29/06* (2006.01)
*H01L 29/78* (2006.01)
*H01L 29/66* (2006.01)
*H01L 29/417* (2006.01)
(Continued)

(52) U.S. Cl.
CPC .. *H01L 29/0653* (2013.01); *H01L 21/823418* (2013.01); *H01L 21/823431* (2013.01); *H01L 21/823475* (2013.01); *H01L 21/823481* (2013.01); *H01L 23/5226* (2013.01); *H01L 23/5283* (2013.01); *H01L 23/5286* (2013.01); *H01L 27/0886* (2013.01); *H01L 29/401* (2013.01); *H01L 29/41791* (2013.01); *H01L 29/66545* (2013.01); *H01L 29/66795* (2013.01); *H01L 29/785* (2013.01)

(58) Field of Classification Search
None
See application file for complete search history.

(56) References Cited

U.S. PATENT DOCUMENTS 8,772,109 B2 7/2014 Colinge
8,785,285 B2 7/2014 Tsai et al.
(Continued)

OTHER PUBLICATIONS

Lou, Qiaowei, et al., "Optical Emission Spectroscopic Studies and Comparisons of CH3F/CO2 and CH3F/O2 Inductively Coupled Plasmas", Plasma Processing Laboratory, Department of Chemical and Biomolecular Engineering, University of Houston, Manuscript# JVSTA-A-14-332.
(Continued)

*Primary Examiner* — Joseph C. Nicely
*Assistant Examiner* — Lamont B Koo
(74) *Attorney, Agent, or Firm* — Haynes and Boone, LLP

(57) ABSTRACT

A semiconductor structure includes an isolation structure; first and second source/drain (S/D) features over the isolation structure, defining a first direction from the first S/D feature to the second S/D feature from a top view; one or more channel layers connecting the first and the second S/D features; a gate structure between the first and the second S/D features and engaging each of the one or more channel layers; and a via structure under the first S/D feature and electrically connecting to the first S/D feature. In a cross-sectional view perpendicular to the first direction, the via structure has a profile that widens and then narrows along a bottom-up direction.

20 Claims, 23 Drawing Sheets

(51) Int. Cl.
*H01L 29/40* (2006.01)
*H01L 21/8234* (2006.01)
*H01L 23/528* (2006.01)
*H01L 27/088* (2006.01)
*H01L 23/522* (2006.01)

(56) References Cited

U.S. PATENT DOCUMENTS

| | | |
|---|---|---|
| 8,802,504 B1 | 8/2014 | Hou et al. |
| 8,803,292 B2 | 8/2014 | Chen et al. |
| 8,803,316 B2 | 8/2014 | Lin et al. |
| 8,816,444 B2 | 8/2014 | Wann et al. |
| 8,823,065 B2 | 9/2014 | Wang et al. |
| 8,860,148 B2 | 10/2014 | Hu et al. |
| 8,993,380 B2 | 3/2015 | Hou et al. |
| 9,105,490 B2 | 8/2015 | Wang et al. |
| 9,236,267 B2 | 1/2016 | De et al. |
| 9,236,300 B2 | 1/2016 | Liaw |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,496,189 B2 | 11/2016 | Yu et al. |
| 9,520,482 B1 | 12/2016 | Chang et al. |
| 9,576,814 B2 | 2/2017 | Wu et al. |
| 9,704,835 B2 | 7/2017 | Feng et al. |
| 9,711,555 B2 | 7/2017 | Lin et al. |
| 2015/0129983 A1* | 5/2015 | Yu .................... H01L 29/66795 438/283 |
| 2019/0259699 A1* | 8/2019 | Morrow ................ H01L 29/401 |

OTHER PUBLICATIONS

Michallet, Jean-Eric, et al. "CoolCube: A True 3DVLSI Alternative to Scaling", Mar. 24, 2015, 3DInCities. https://www.3dincites.com/2015/03/coolcube-a-true-3dvlsi-alternative-to-scaling/.

Chen, Hsin-Ping, et al., "Semiconductor Device with Conductors Embedded in a Substrate", U.S. Appl. No. 16/751,158, filed Jan. 24, 2020, Assignee: Taiwan Semiconductor Manufacturing Co., Ltd., 29 pages specification, 19 pages drawings.

\* cited by examiner

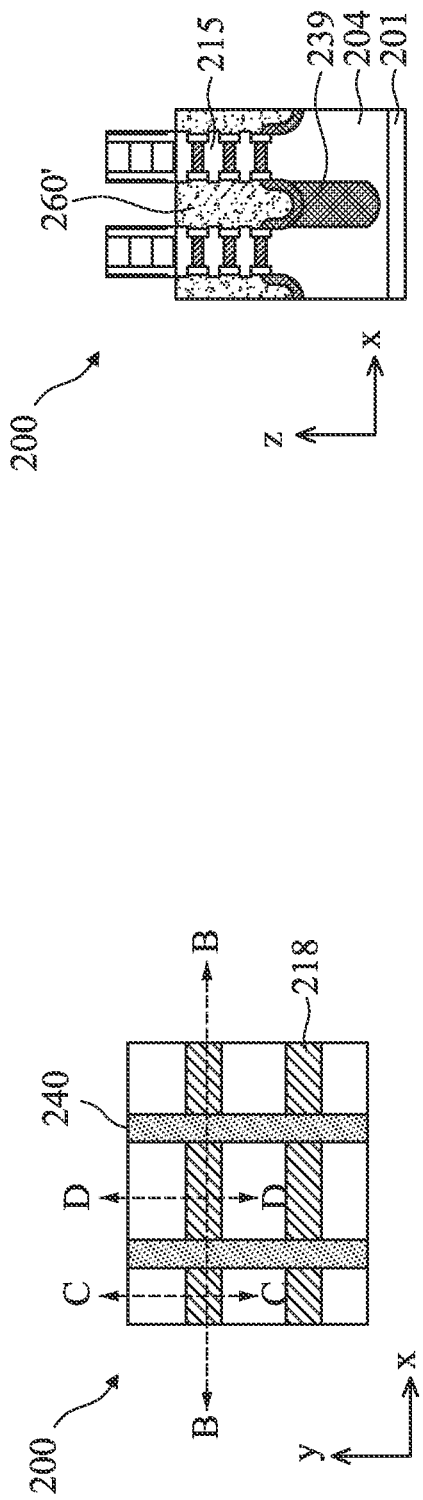
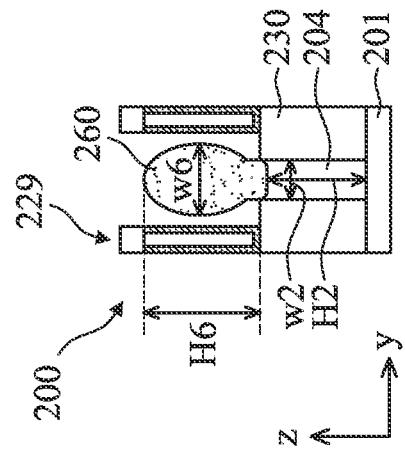
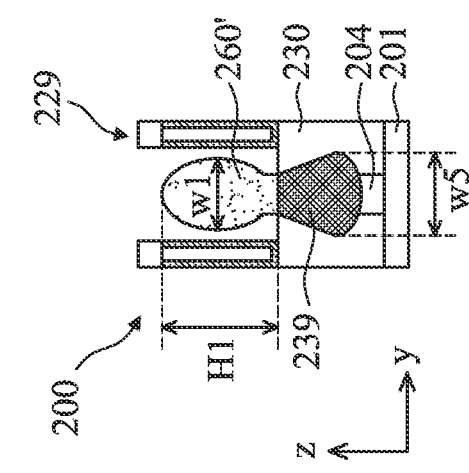

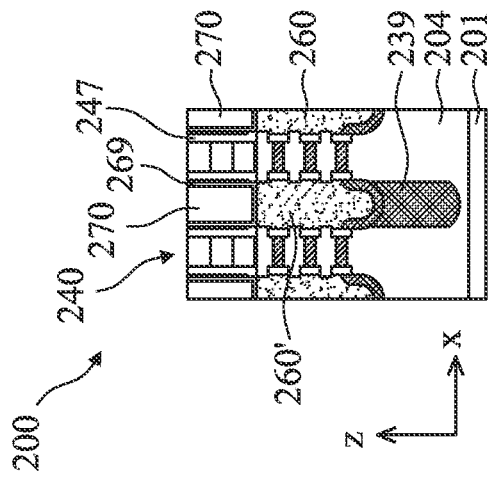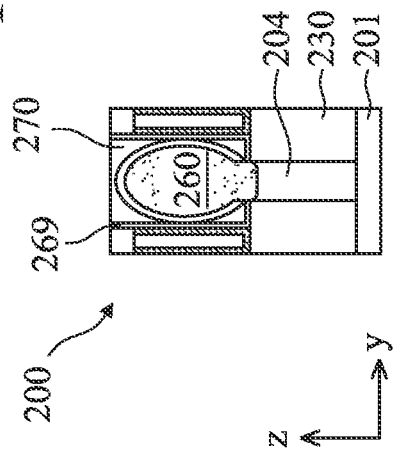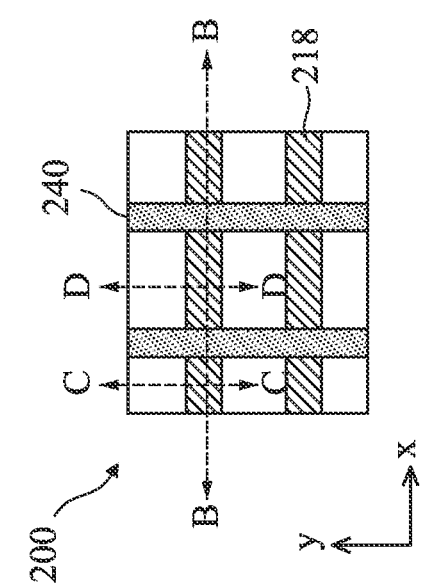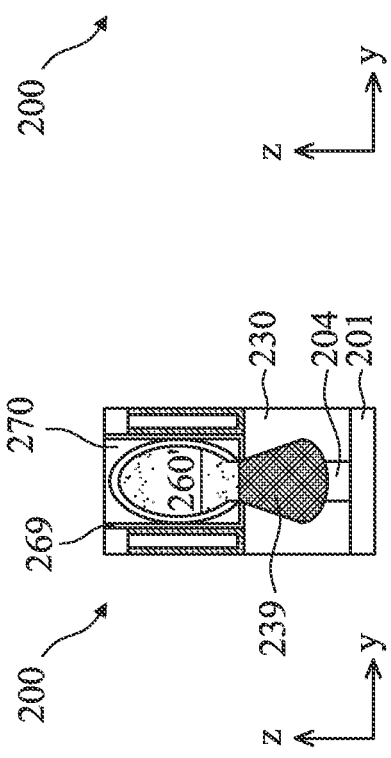
FIG. 12A
FIG. 12B
FIG. 12C
FIG. 12D

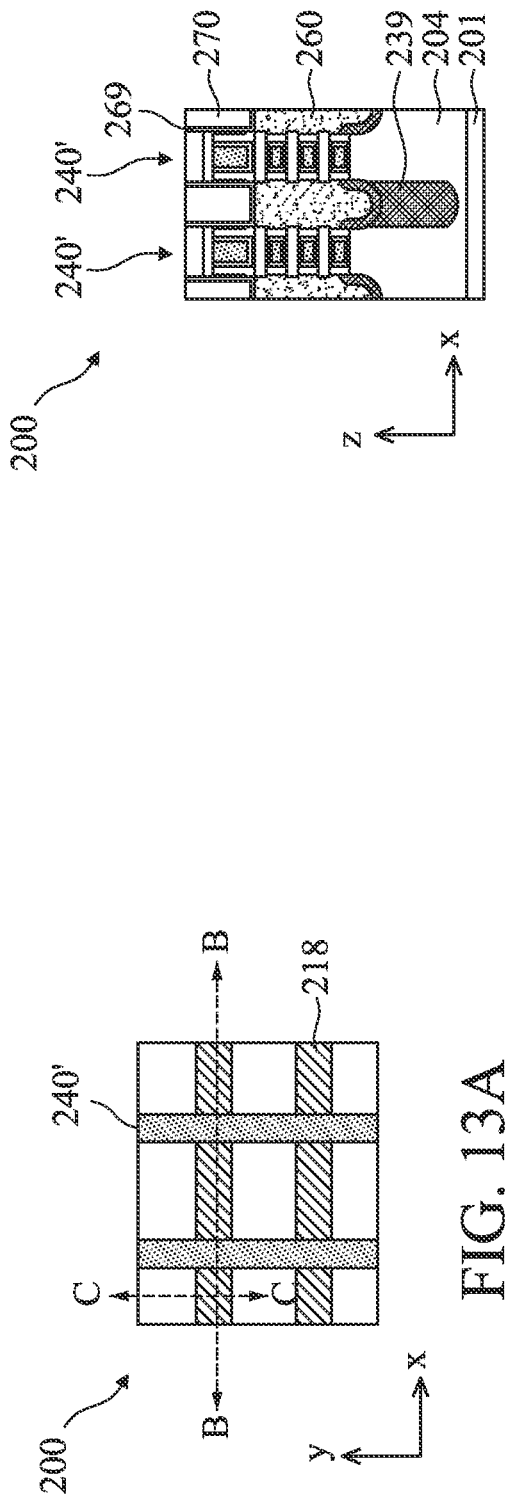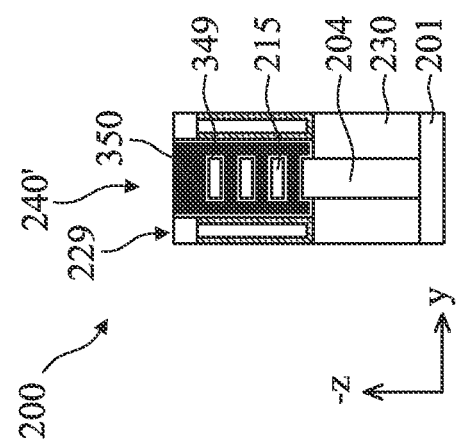
FIG. 13A
FIG. 13B
FIG. 13C

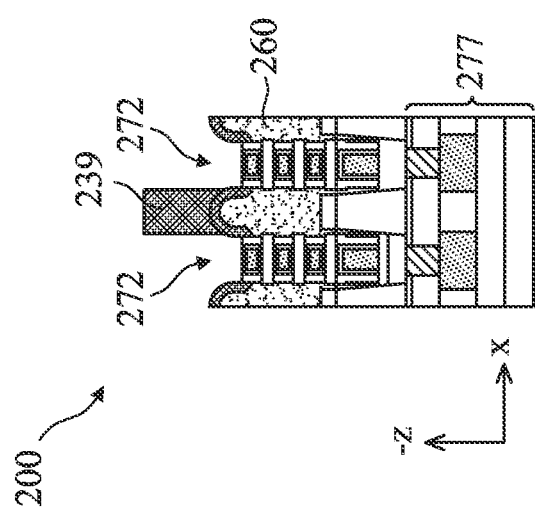
FIG. 17A
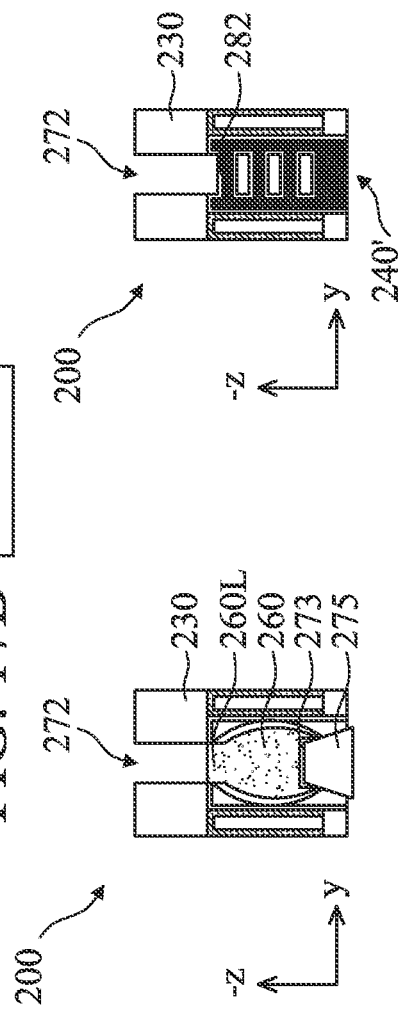
FIG. 17B
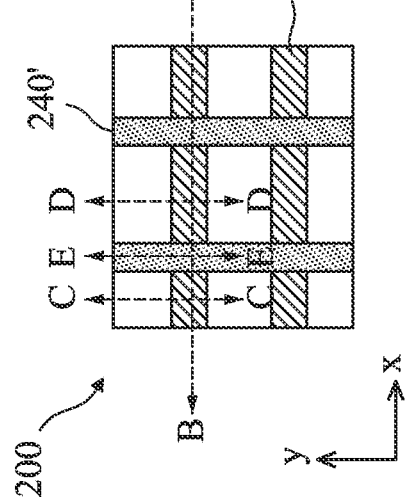
FIG. 17C
FIG. 17D
FIG. 17E

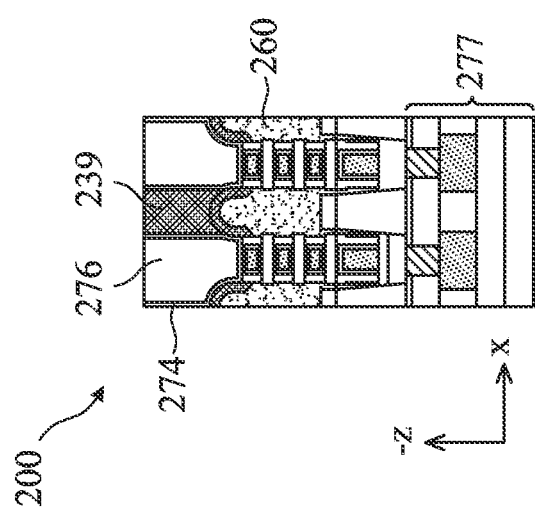
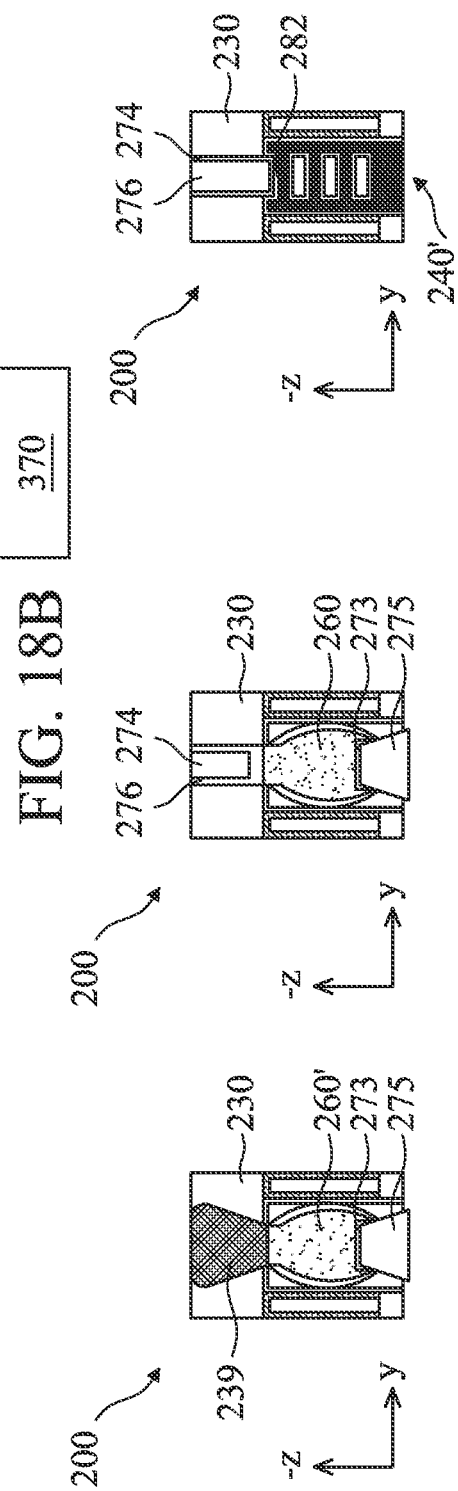
FIG. 18A
FIG. 18B
FIG. 18C
FIG. 18D
FIG. 18E

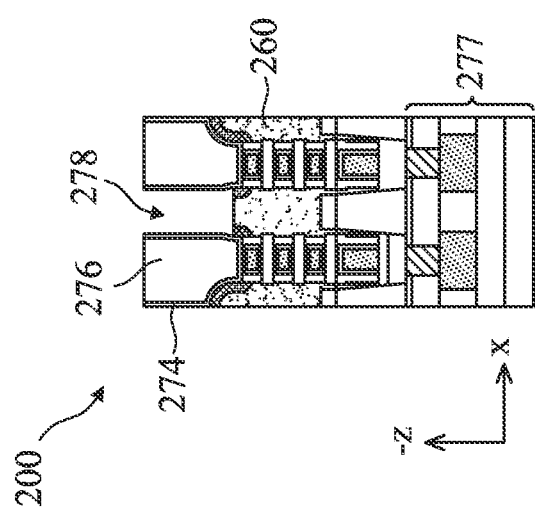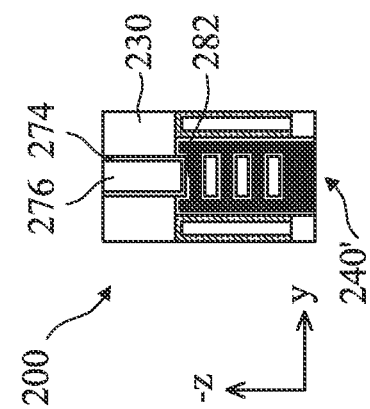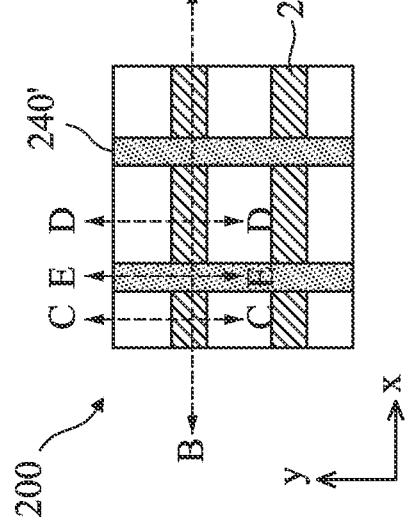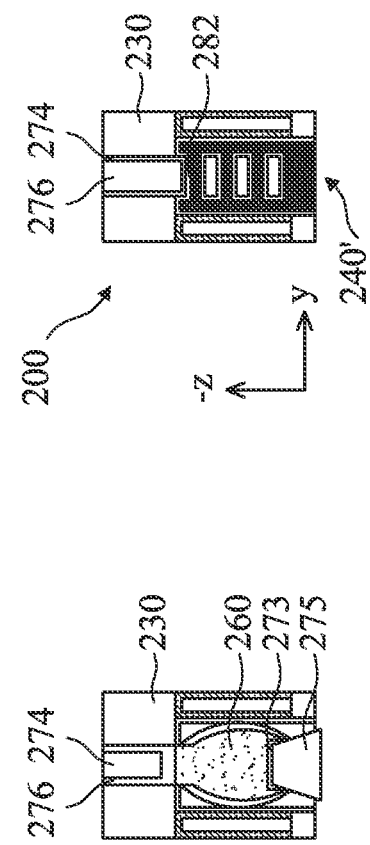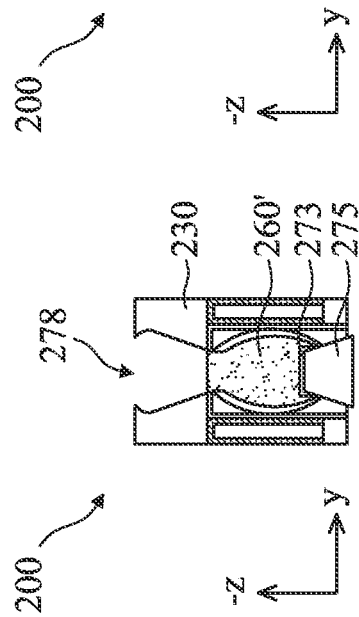
FIG. 19A
FIG. 19B
FIG. 19C
FIG. 19D
FIG. 19E

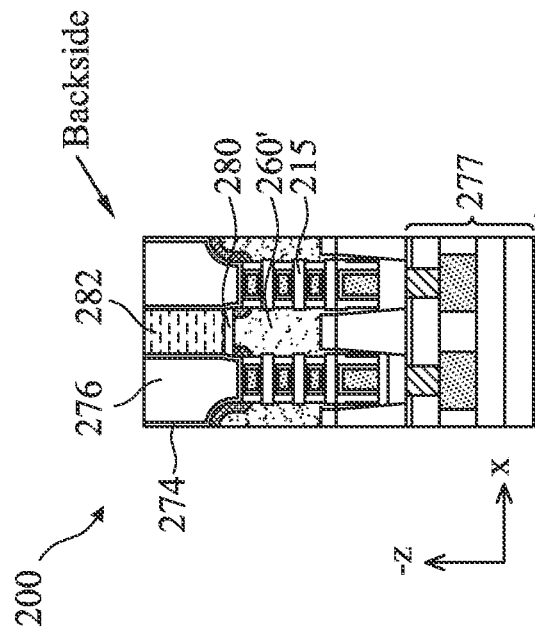
FIG. 20A
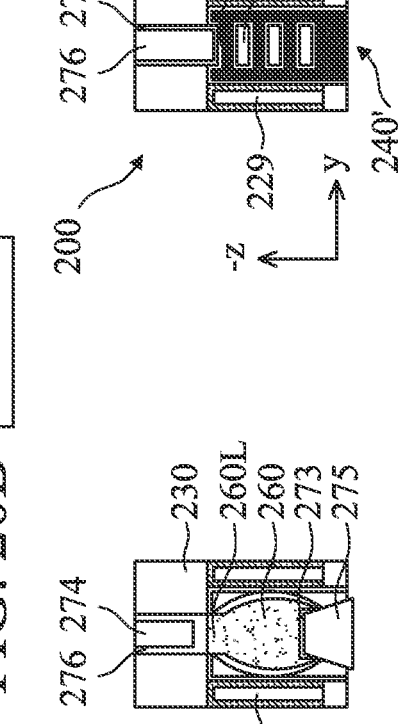
FIG. 20B
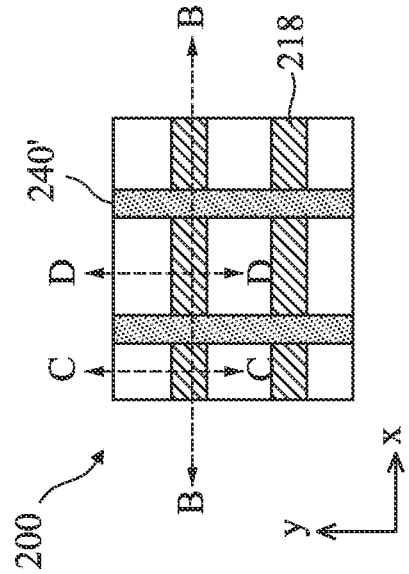
FIG. 20C
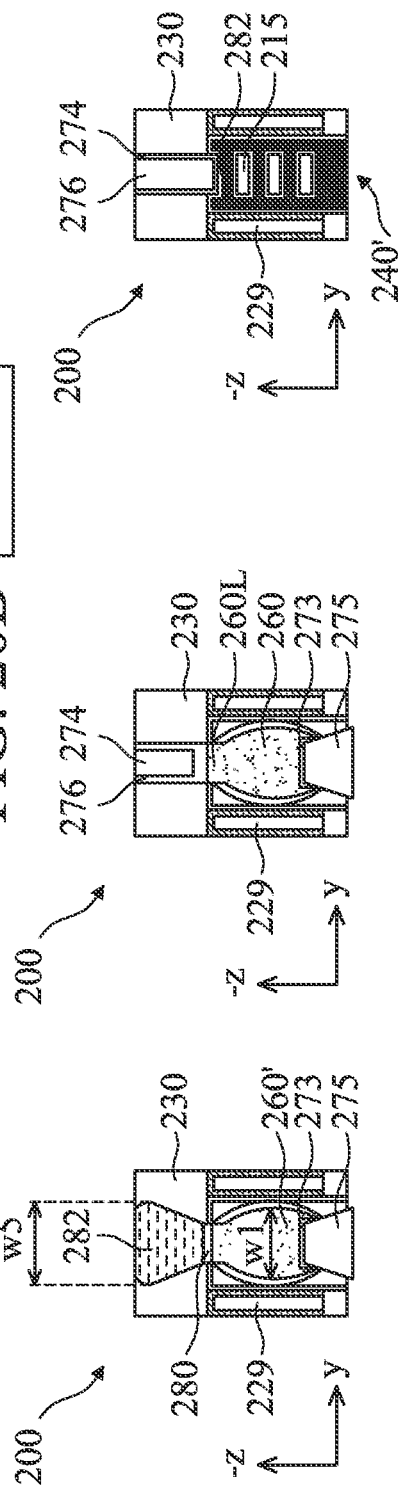
FIG. 20D
FIG. 20E

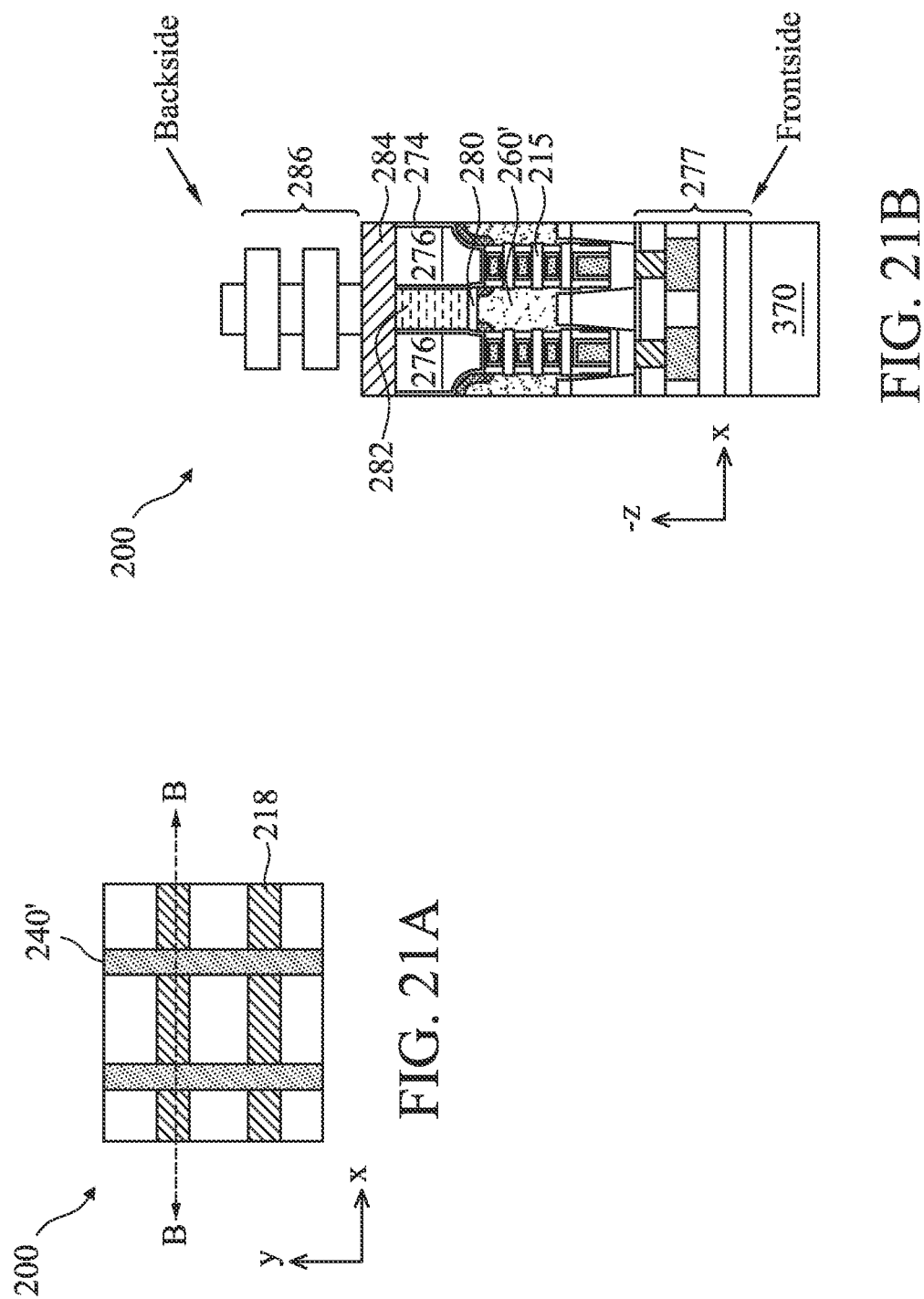

EPITAXIAL SOURCE/DRAIN FEATURE WITH ENLARGED LOWER SECTION INTERFACING WITH BACKSIDE VIA

BACKGROUND

Conventionally, integrated circuits (IC) are built in a stacked-up fashion, having transistors at the lowest level and interconnect (vias and wires) on top of the transistors to provide connectivity to the transistors. Power rails (e.g., metal lines for voltage sources and ground planes) are also above the transistors and may be part of the interconnect. As the integrated circuits continue to scale down, so do the power rails. This inevitably leads to increased voltage drop across the power rails, as well as increased power consumption of the integrated circuits. Therefore, although existing approaches in semiconductor fabrication have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2, 3A, 3B, 4A, 4B, 4C, 5A, 5B, 5C, 5D, 6A, 6B, 6C, 6D, 7A, 7B, 7C, 7D, 8A, 8B, 8C, 8D, 9A, 9B, 9C, 9D, 10A, 10B, 10C, 10D, 11A, 11B, 11C, 11D, 12A, 12B, 12C, 12D, 13A, 13B, 13C, 14A, 14B, 14C, 14D, 15A, 15B, 15C, 15D, 15E, 16A, 16B, 16C, 16D, 16E, 17A, 17B, 17C, 17D, 17E, 18A, 18B, 18C, 18D, 18E, 19A, 19B, 19C, 19D, 19E, 20A, 20B, 20C, 20D, 20E, 21A, and 21B illustrate top and cross-sectional views of a portion of a semiconductor device, according to some embodiments, in intermediate steps of fabrication according to embodiments of the method of FIGS. 1A-1C.

DETAILED DESCRIPTION

Figure 1A:
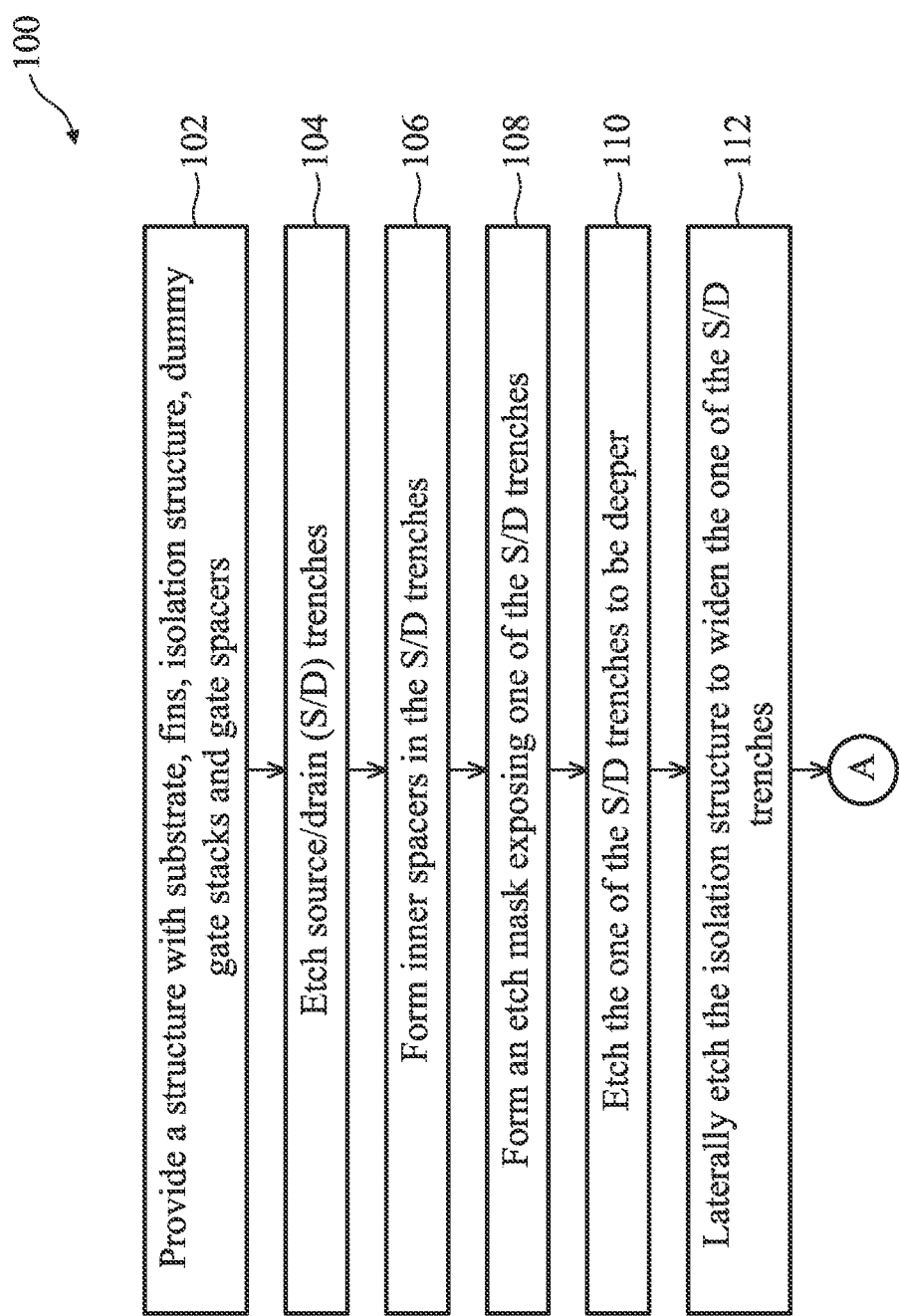
FIGS. 1A, 1B, and 1C show a flow chart of a method, in various embodiments, of forming enlarged epitaxial source/drain features that enable resistance reduction with backside power rails, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

This application generally relates to semiconductor structures and fabrication processes, and more particularly to semiconductor devices with backside power rails and backside self-aligned vias. As discussed above, power rails in IC need further improvement in order to provide the needed performance boost as well as reducing power consumption. An object of the present disclosure includes providing power rails (or power routings) on a back side (or backside) of a structure containing transistors (such as gate-all-around (GAA) transistors and/or FinFET transistors) in addition to an interconnect structure (which may include power rails as well) on a front side (or frontside) of the structure. This increases the number of metal tracks available in the structure for directly connecting to source/drain contacts and vias. It also increases the gate density for greater device integration than existing structures without the backside power rails. The backside power rails may have wider dimension than the first level metal (M0) tracks on the frontside of the structure, which beneficially reduces the power rail resistance. The present disclosure also provides structures and methods for reducing the resistance between the backside power rails and the source/drain (S/D) features (which are at the frontside of the device). The size of the S/D features and the contact area between the S/D features and the backside vias are often limited by the width of active regions, such as the width of semiconductor fins. Embodiments of the present disclosure use additional lateral etching process(es) to break through the dielectric layer(s) surrounding semiconductor fins, thereby enlarging the bottom of the S/D trenches. This provides a large area for interfacing with the backside vias, which beneficially reduce the contact resistance between the S/D features and the backside power rails.

The details of the structure and fabrication methods of the present disclosure are described below in conjunction with the accompanied drawings, which illustrate a process of making a GAA device, according to some embodiments. A GAA device refers to a device having vertically-stacked horizontally-oriented multi-channel transistors, such as nanowire transistors and nanosheet transistors. GAA devices are promising candidates to take CMOS to the next stage of the roadmap due to their better gate control ability, lower leakage current, and fully FinFET device layout compatibility. For the purposes of simplicity, the present disclosure uses GAA devices as an example. Those of ordinary skill in the art should appreciate that they may readily use the present disclosure as a basis for designing or modifying other processes and structures (such as FinFET devices) for carrying out the same purposes and/or achieving the same advantages of the embodiments introduced herein.

Figure 1B:
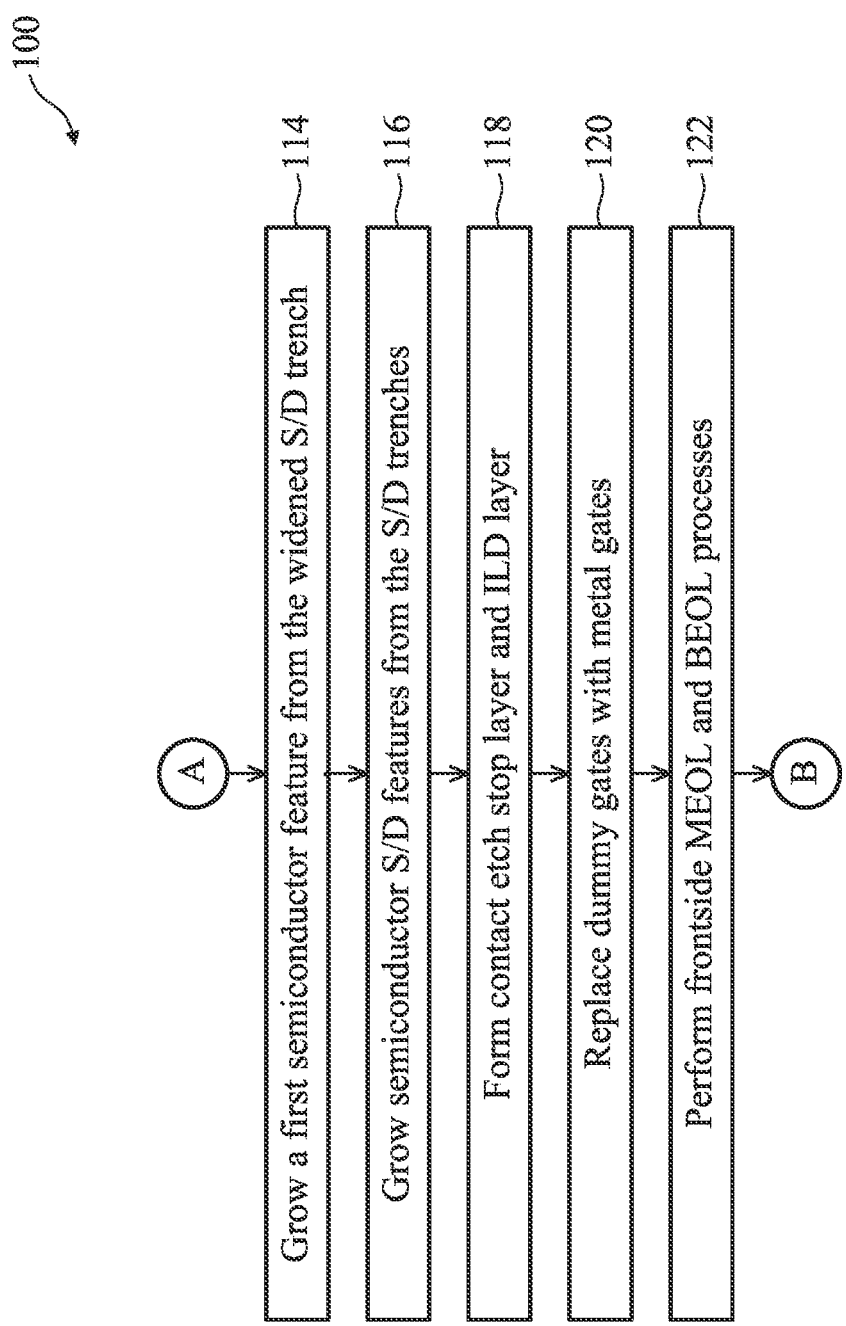
Figure 1C:
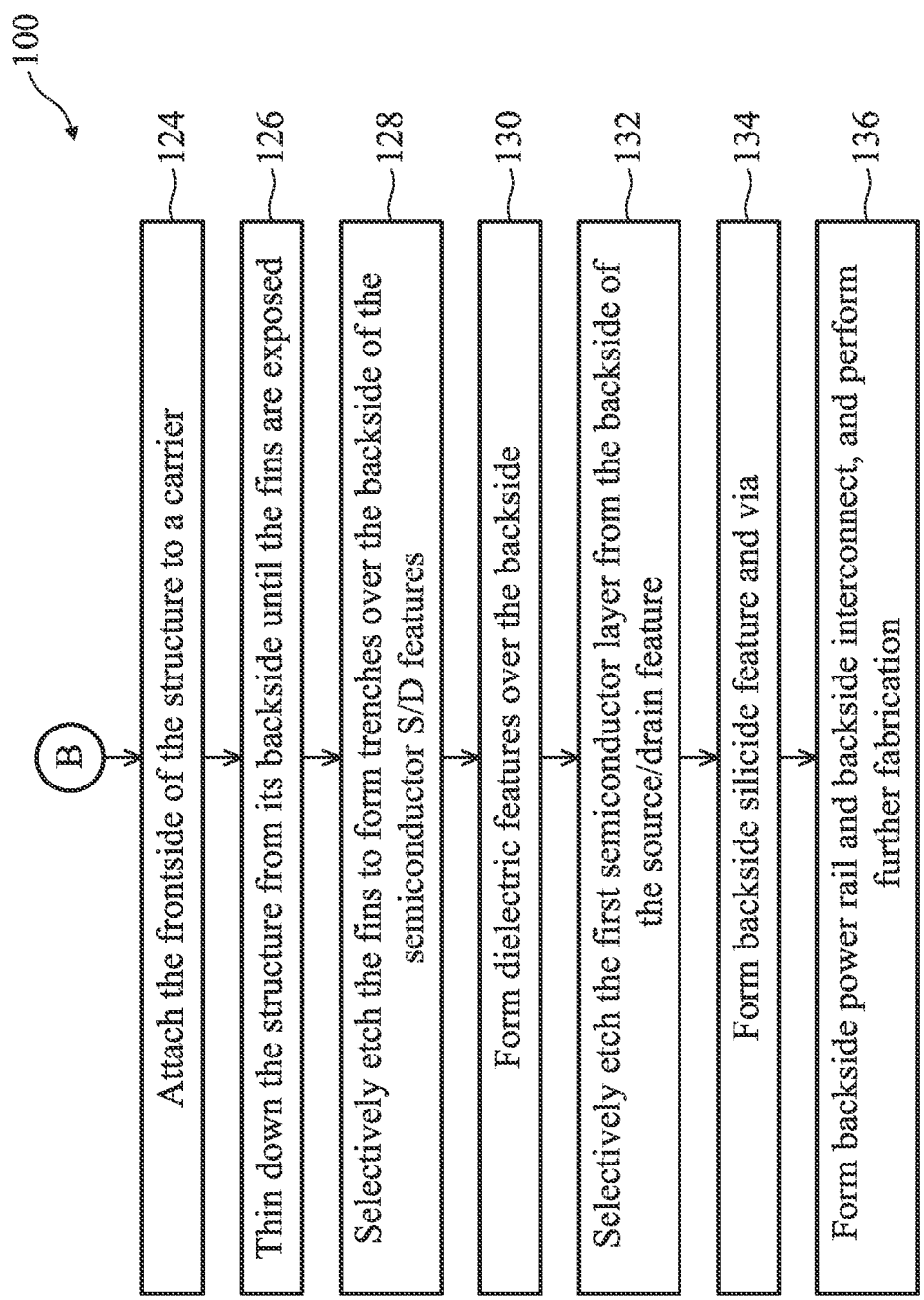

FIGS. 1A, 1B, and 1C are a flow chart of a method 100 for fabricating a semiconductor device according to various aspects of the present disclosure. Additional processing is contemplated by the present disclosure. Additional operations can be provided before, during, and after method 100, and some of the operations described can be moved, replaced, or eliminated for additional embodiments of method 100.

Method 100 is described below in conjunction with FIG. 2 through FIG. 21B that illustrate various top and cross-sectional views of a semiconductor device (or a semiconductor structure) 200 at various steps of fabrication according to the method 100, in accordance with some embodiments. In some embodiments, the device 200 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), FinFET, nanosheet FETs, nanowire FETs, other types of multi-gate FETs, metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, memory devices, other suitable components, or combinations thereof. FIGS. 2 through 21B have been simplified for the sake of clarity to better understand the inventive concepts of the present disclosure. Additional features can be added in the device 200, and some of the features described below can be replaced, modified, or eliminated in other embodiments of the device 200.

At operation 102, the method 100 (FIG. 1A) provides a structure that includes a substrate 201 with various components built in or on the substrate 201, including semiconductor fins 218, an isolation structure 230, dielectric (isolation) fins 229, sacrificial (or dummy) gate stacks 240, gate spacers 247, and various other components, such as shown in FIGS. 2 through 4C. These components and the methods of making them are further discussed below by referring to FIGS. 2 through 4C.

Figure 2:
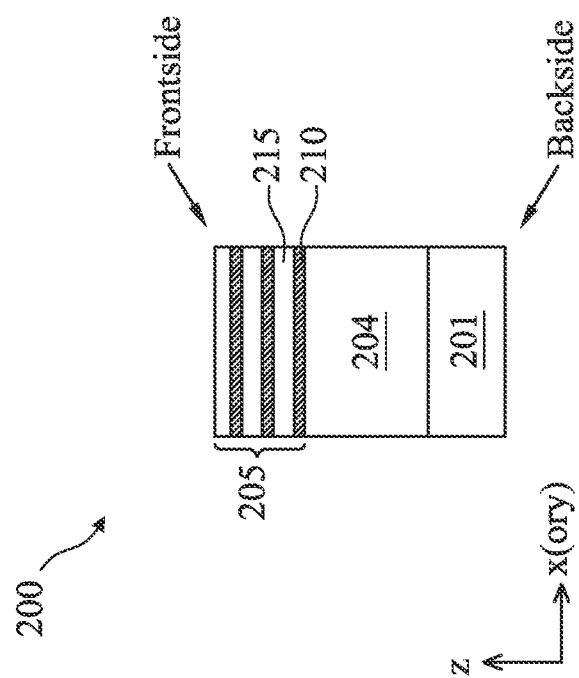

Referring to FIG. 2, a stack 205 of semiconductor layers 210 and 215 are formed over a semiconductor layer 204 over a substrate 201. In an embodiment, the substrate 201 is a bulk silicon substrate (i.e., including bulk single-crystalline silicon). The substrate 201 may include other semiconductor materials in various embodiment, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof. In an alternative embodiment, substrate 201 is a semiconductor-on-insulator substrate, such as a silicon-on-insulator (SOI) substrate, a silicon germanium-on-insulator (SGOI) substrate, or a germanium-on-insulator (GOI) substrate. In embodiments, the semiconductor layer 204 can be silicon, silicon germanium, germanium, or other suitable semiconductor, and may be doped n-type or p-type dopants.

The semiconductor layer stack 205 includes semiconductor layers 210 and semiconductor layers 215 stacked vertically (e.g., along the z-direction) in an interleaving or alternating configuration. In some embodiments, semiconductor layers 210 and semiconductor layers 215 are epitaxially grown in the depicted interleaving and alternating configuration. Epitaxial growth of semiconductor layers 210 and semiconductor layers 215 may be achieved by a molecular beam epitaxy (MBE) process, a chemical vapor deposition (CVD) process, a metalorganic chemical vapor deposition (MOCVD) process, other suitable epitaxial growth process, or combinations thereof. A composition of semiconductor layers 210 is different than a composition of semiconductor layers 215 to achieve etching selectivity and/or different oxidation rates during subsequent processing. For example, semiconductor layers 210 and semiconductor layers 215 may include different materials, constituent atomic percentages, constituent weight percentages, thicknesses, and/or characteristics to achieve desired etching selectivity and/or different oxidation rates. For example, semiconductor layers 210 include silicon germanium and semiconductor layers 215 include silicon, in an embodiment. In some embodiments, semiconductor layers 210 and semiconductor layers 215 can include the same material but with different constituent atomic percentages to achieve the etching selectivity and/or different oxidation rates. For example, both semiconductor layers 210 and 215 can include silicon germanium, where semiconductor layers 210 have a first silicon atomic percent and/or a first germanium atomic percent and semiconductor layers 215 have a second, different silicon atomic percent and/or a second, different germanium atomic percent. The present disclosure contemplates that semiconductor layers 210 and semiconductor layers 215 include any combination of semiconductor materials that can provide desired etching selectivity, desired oxidation rate differences, and/or desired performance characteristics (e.g., materials that maximize current flow), including any of the semiconductor materials disclosed herein.

As described further below, semiconductor layers 215 or portions thereof form channel regions of the device 200. In the depicted embodiment, semiconductor layer stack 205 includes three semiconductor layers 210 and three semiconductor layers 215. After undergoing subsequent processing, such configuration will result in the device 200 having three channels. However, the present disclosure contemplates embodiments where semiconductor layer stack 205 includes more or less semiconductor layers, for example, depending on a number of channels desired for the device 200. For example, semiconductor layer stack 205 can include two to ten semiconductor layers 210 and two to ten semiconductor layers 215. In an alternative embodiment where the device 200 is a FinFET device, the stack 205 is simply one layer of a semiconductor material, such as one layer of Si. As will be discussed, the method 100 will process layers at both sides of the substrate 201. In the present disclosure, the side of the substrate 201 where the stack 205 resides is referred to as the frontside and the side opposite the frontside is referred to as the backside.

Figure 3B:
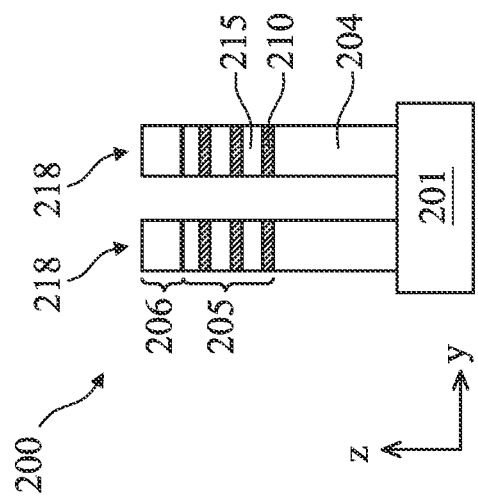
Figure 3A:
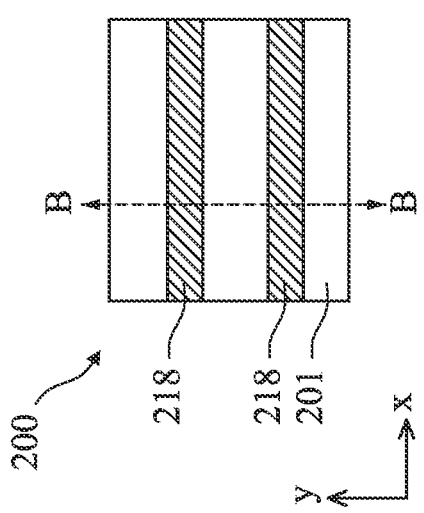

FIG. 3A illustrates a top view of the device 200 with fins 218 oriented along the "x" direction, and FIG. 3B illustrates a cross-sectional view of the device 200, in portion, along the B-B line in FIG. 3A. As illustrated in FIG. 3B, the fins 218 include the patterned stack 205 (having layers 210 and 215), patterned regions 204, and one or more patterned hard mask layers 206. The fins 218 may be patterned by any suitable method. For example, the fin 218 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the stack 205 and patterned using a photolithography process. Spacers are formed alongside the patterned sacrificial layer using a self-aligned process. The sacrificial layer is then removed, and the remaining spacers, or mandrels, may then be used as a masking element for patterning the fins 218. For example, the masking element may be used for etching recesses into the stack 205 and the substrate 201, leaving the fins 218 on the substrate 201. The etching process may include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. Numerous other embodiments of methods to form the fins 218 may be suitable.

Figure 4A:
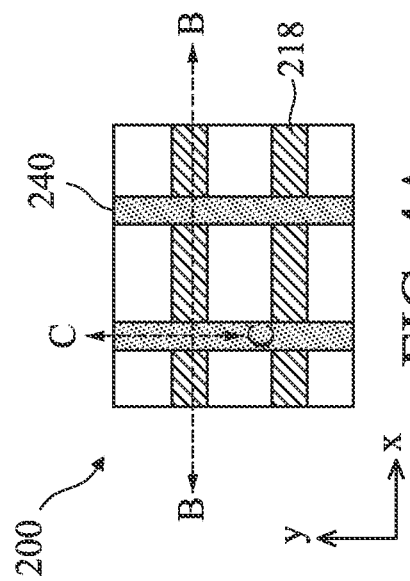
Figure 4B:
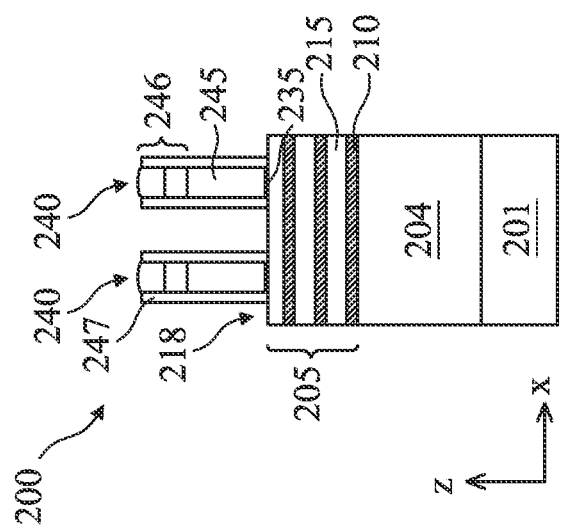
Figure 4C:
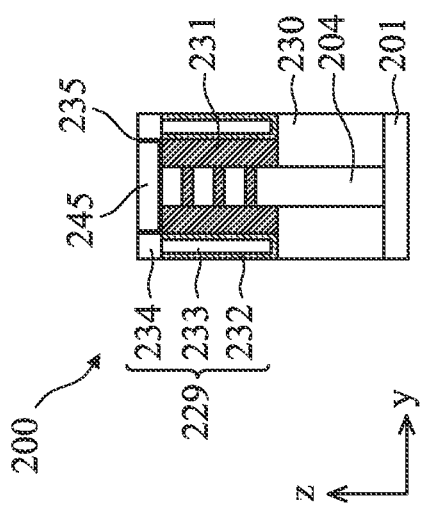

FIG. 4A illustrates a top view of the device 200, and FIGS. 4B and 4C illustrate cross-sectional views of the device 200, in portion, along the B-B line and the C-C line of FIG. 4A, respectively. Referring to FIGS. 4A, 4B, and 4C, various components are built around and/or above the fins 218, including an isolation structure (or feature) 230 isolating the bottom portion of the fins 218, a cladding layer 231 over the isolation structure 230 and on sidewalls of the fins 218, dielectric (or dummy) fins 229 over the isolation structure 230 and on sidewalls of the cladding layer 231, sacrificial gate stacks 240 over the fins 218, and gate spacers 247 on sidewalls of the sacrificial gate stacks 240.

Referring to FIG. 4C, the isolation feature(s) 230 is formed over substrate 201 to isolate various regions of the device 200. For example, isolation features 230 surround a bottom portion of fins 218 to separate and isolate fins 218 from each other. Isolation features 230 include silicon oxide, silicon nitride, silicon oxynitride, other suitable isolation material (for example, including silicon, oxygen, nitrogen, carbon, or other suitable isolation constituent), or combinations thereof. Isolation features 230 can include different structures, such as shallow trench isolation (STI) structures and/or deep trench isolation (DTI) structures. In an embodiment, the isolation features 230 can be formed by filling the trenches between fins 218 with insulator material (for example, by using a CVD process or a spin-on glass process), performing a chemical mechanical polishing (CMP) process to remove excessive insulator material and/or planarize a top surface of the insulator material layer, and etching back the insulator material layer to form isolation features 230. In some embodiments, isolation features 230 include a multi-layer structure, such as a silicon nitride layer disposed over a thermal oxide liner layer.

The cladding layer 231 is deposited over the sidewall surfaces of the fins 218 and above the isolation features 230. In an embodiment, the cladding layer 231 includes SiGe. The cladding layer 231 may be deposited using CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), other suitable methods, or combinations thereof.

In the present embodiment, the dielectric fin 229 includes a dielectric liner 232, a dielectric fill layer 233, and a dielectric helmet 234. The dielectric fin 229 may be configured differently in alternative embodiments. The dielectric liner 232 is deposited over the sidewalls of the cladding layer 231 and on top surfaces of the isolation features 230, and the dielectric fill layer 233 is deposited over the dielectric liner 232 and fills gaps between the fins 218. In an embodiment, the dielectric liner 232 includes a low-k dielectric material such as a dielectric material including Si, O, N, and C. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SILK (Dow Chemical, Midland, Mich.), polyimide, or combinations thereof. Low-k dielectric material generally refers to dielectric materials having a low dielectric constant, for example, lower than that of silicon oxide (k≈3.9). The dielectric liner 232 may be deposited using CVD, PVD, ALD, HDPCVD, MOCVD, RPCVD, PECVD, LPCVD, ALCVD, APCVD, other suitable methods, or combinations thereof. In an embodiment, the dielectric fill layer 233 includes silicon oxide, silicon nitride, silicon oxynitride, TEOS formed oxide, PSG, BPSG, low-k dielectric material, other suitable dielectric material, or combinations thereof. The dielectric fill layer 233 may be deposited using a flowable CVD (FCVD) process that includes, for example, depositing a flowable material (such as a liquid compound) over the device 200 and converting the flowable material to a solid material by a suitable technique, such as thermal annealing and/or ultraviolet radiation treating. The dielectric fill layer 233 may be deposited using other types of methods.

The dielectric helmet 234 is deposited over the dielectric layers 232 and 233 and between the cladding layer 231 on opposing sidewalls of the fins 218. In an embodiment, the dielectric helmet 234 includes a high-k dielectric material, such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), (Ba,Sr)$TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide (k≈3.9). The dielectric helmet 234 is formed by any of the processes described herein, such as ALD, CVD, PVD, oxidation-based deposition process, other suitable process, or combinations thereof. In an embodiment, the dielectric layers 232 and 233 may be recessed using a selective etching process that etches the dielectric layers 232 and 233 with no (or minimal) etching to the hard mask 206 (FIG. 3B) and the cladding layer 231. Then, one or more dielectric materials are deposited into the recesses and a CMP process is performed to the one or more dielectric materials to form the dielectric helmet 234. Subsequently, the hard mask layers 206 is removed, and the sacrificial gate stacks 240 are formed over the fins 218.

Referring to FIG. 4B, the sacrificial gate stacks 240 include a dummy gate dielectric layer 235, a dummy gate electrode layer 245, and one or more hard mask layers 246. In the present embodiment, the sacrificial gate stacks 240 will be replaced with functional gate stacks 240' in a later fabrication step. In some embodiments, the dummy gate dielectric 235 includes a dielectric material, such as silicon oxide, a high-k dielectric material, other suitable dielectric material, or combinations thereof; the dummy gate electrode layer 245 includes polysilicon or other suitable material; and the one or more hard mask layers 246 include silicon oxide, silicon nitride, or other suitable materials. Sacrificial gate stacks 240 are formed by deposition processes, lithography processes, etching processes, other suitable processes, or combinations thereof. For example, the layers 235, 245, and 246 may be deposited using CVD, PVD, ALD, or other suitable methods. Then, a lithography patterning and etching process is performed to pattern the layers 235, 245, and 246 to form sacrificial gate stacks 240, as depicted in FIG. 4B. The lithography patterning processes include resist coating (for example, spin-on coating), soft baking, mask aligning, exposure, post-exposure baking, developing the resist, rinsing, drying (for example, hard baking), other suitable lithography processes, or combinations thereof. The etching processes include dry etching processes, wet etching processes, other etching methods, or combinations thereof.

Still referring to FIG. 4B, the gate spacers 247 are disposed on sidewalls of the sacrificial gate stacks 240. Gate spacers 247 are formed by any suitable process and include a dielectric material. The dielectric material can include silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). For example, a dielectric layer including silicon and nitrogen, such as a silicon nitride layer, can be deposited over sacrificial gate stacks 240 and subsequently etched (e.g., anisotropically etched) to form gate spacers 247. In some embodiments, gate spacers 247 include a multi-layer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent to sacrificial gate stacks 240.

Figure 5B:
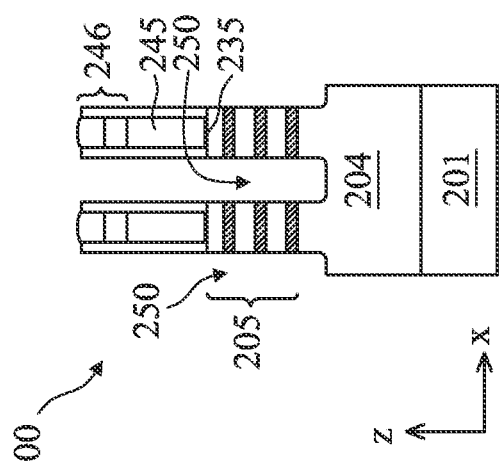
Figure 5D:
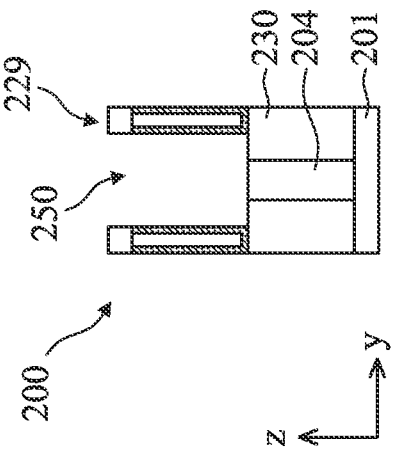
Figure 5A:
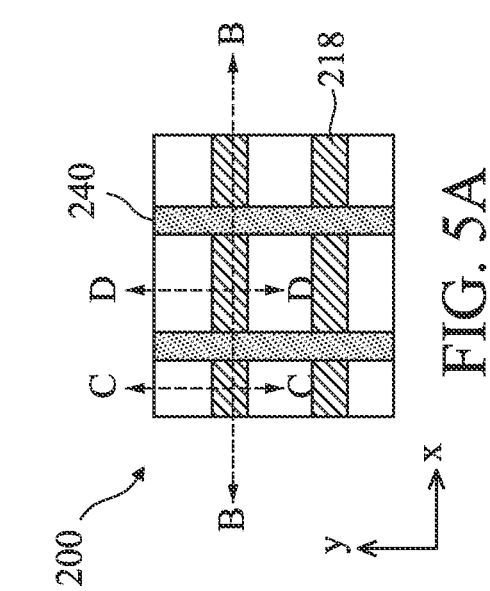
Figure 5C:
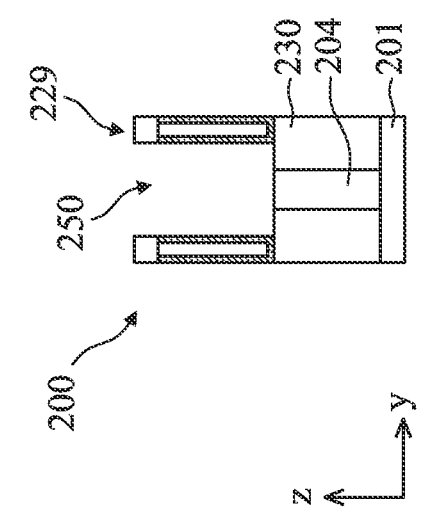

At operation 104, the method 100 (FIG. 1A) forms source/drain (S/D) trenches 250 by etching the fins 218 adjacent the gate spacers 247. The resultant structure is shown in FIGS. 5A-5D according to an embodiment. FIG. 5A illustrates a top view of the device 200, and FIGS. 5B, 5C, and 5D illustrate cross-sectional views of the device 200, in portion, along the B-B line, the C-C line, and the D-D line in FIG. 5A, respectively. Particularly, the C-C line is cut into the source regions of the transistors and is parallel to the gate stacks 240, and the D-D line is cut into the drain regions of the transistors and is parallel to the gate stacks 240. The C-C lines and the D-D lines in FIGS. 6A through 12A, 14A through 20A are similarly configured.

In the depicted embodiment, an etching process completely removes semiconductor layer stack 205 in source/drain regions of fins 218 thereby exposing the semiconductor layer 204 of fins 218 in the source/drain regions. Source/drain trenches 250 thus have sidewalls defined by remaining portions of semiconductor layer stack 205, which are disposed in channel regions under the gate stacks 240, and bottoms defined by the semiconductor layer 204 and the isolation structure 230. In some embodiments, the etching process removes some, but not all, of semiconductor layer stack 205, such that source/drain trenches 250 have bottoms defined by semiconductor layer 210 or semiconductor layer 215 in source/drain regions. In some embodiments, the etching process further removes some, but not all, of the semiconductor layer 204 of fins 218, such that source/drain trenches 250 extend below a topmost surface of the isolation structure 230. The etching process can include a dry etching process, a wet etching process, other suitable etching process, or combinations thereof. In some embodiments, the etching process is a multi-step etch process. For example, the etching process may alternate etchants to separately and alternately remove semiconductor layers 210 and semiconductor layers 215. In some embodiments, parameters of the etching process are configured to selectively etch semiconductor layer stack with minimal (to no) etching of gate stacks 240 and/or isolation features 230. In some embodiments, a lithography process, such as those described herein, is performed to form a patterned mask layer that covers gate stacks 240 and/or isolation features 230, and the etching process uses the patterned mask layer as an etch mask.

Figure 6B:
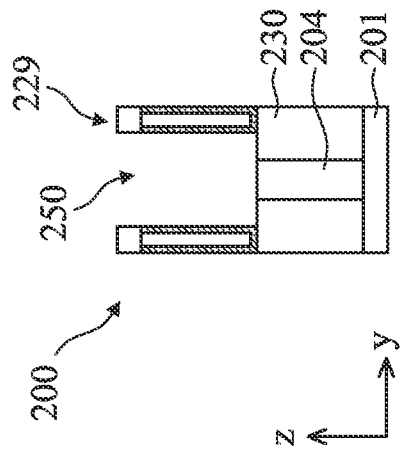
Figure 6A:
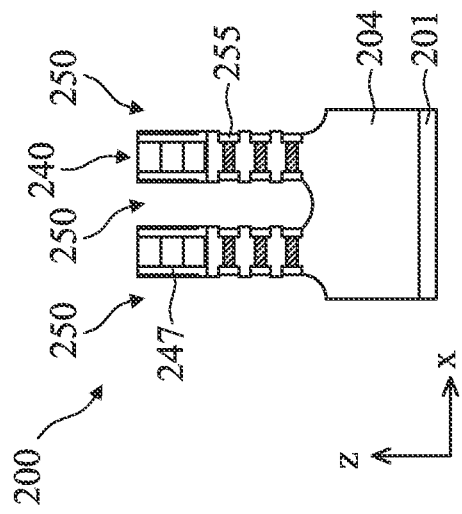
Figure 6D:
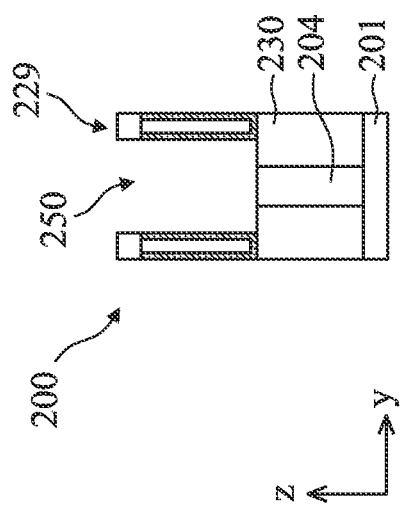
Figure 6C:
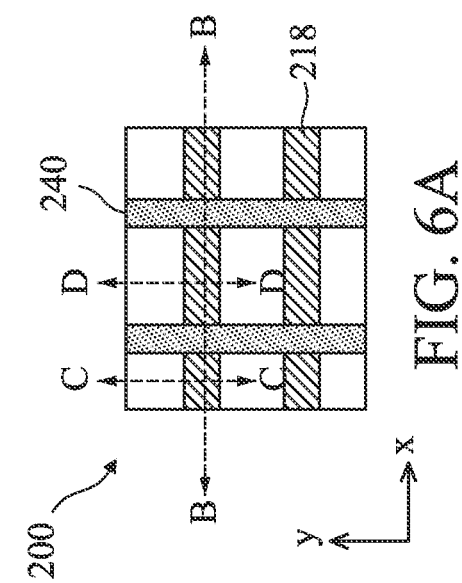

At operation 106, the method 100 (FIG. 1A) forms inner spacers 255. The resultant structure is shown in FIGS. 6A-6D. FIG. 6A illustrates a top view of the device 200, and FIGS. 6B, 6C, and 6D illustrate cross-sectional views of the device 200, in portion, along the B-B line, the C-C line, and the D-D line in FIG. 6A, respectively. In an embodiment, a first etching process is performed that selectively etches semiconductor layers 210 exposed by source/drain trenches 250 with minimal (to no) etching of semiconductor layers 215, such that gaps are formed between semiconductor layers 215 and between semiconductor layers 215 and 204 under gate spacers 247. Portions (edges) of semiconductor layers 215 are thus suspended in the channel regions under gate spacers 247. The first etching process is a dry etching process, a wet etching process, other suitable etching process, or combinations thereof. A deposition process then forms a spacer layer that partially (and, in some embodiments, completely) fills the source/drain trenches 250. The deposition process is configured to ensure that the spacer layer fills the gaps between semiconductor layers 215 and between semiconductor layers 215 and 204 under gate spacers 247. A second etching process is then performed that selectively etches the spacer layer to form inner spacers 255 as depicted in FIG. 6B with minimal (to no) etching of semiconductor layers 215, dummy gate stacks 240, and gate spacers 247. The inner spacers 255 include a material that is different than a material of semiconductor layers 215 and a material of gate spacers 247 to achieve desired etching selectivity during the second etching process. The spacer layer 255 may include a dielectric material that includes silicon, oxygen, carbon, nitrogen, other suitable material, or combinations thereof (for example, silicon oxide, silicon nitride, silicon oxynitride, silicon carbide, or silicon oxycarbonitride). In some embodiments, the inner spacer layer 255 includes a low-k dielectric material, such as those described herein.

Figure 7B:
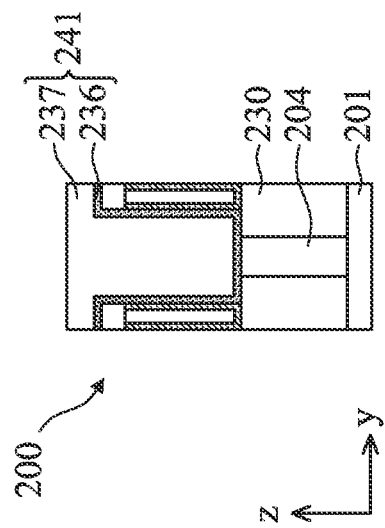
Figure 7D:
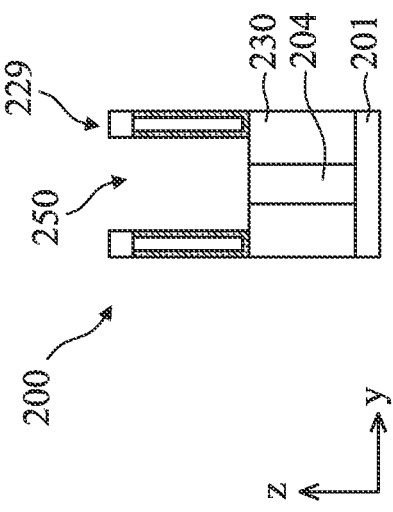
Figure 7A:
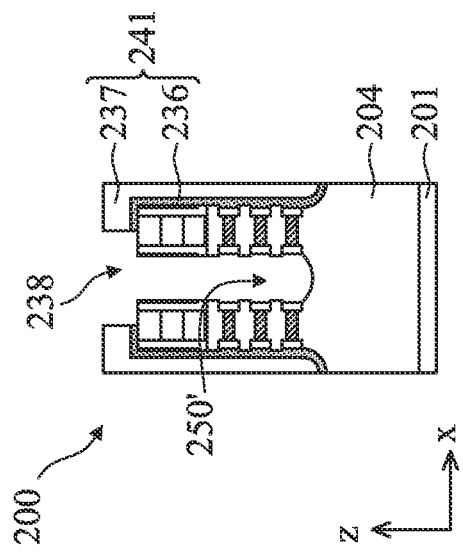
Figure 7C:
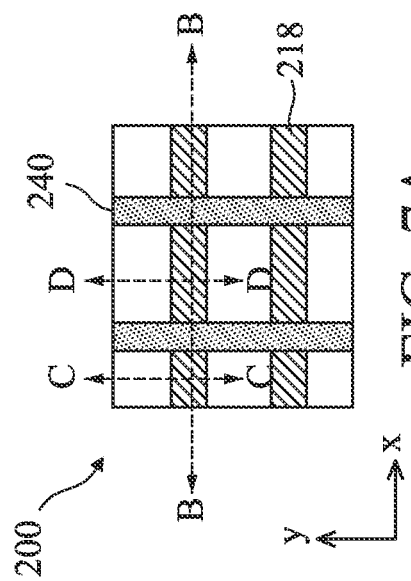

At operation 108, the method 100 (FIG. 1A) forms an etch mask 241 that covers some of the S/D trenches 250 and leaves others of the S/D trenches 250 exposed through openings 238 in the etch mask 241. The S/D trenches 250 that are exposed through the etch mask 241 will go through additional processes to provide S/D features with an enlarged bottom section for reducing contact resistance with backside power rails. FIG. 7A illustrates a top view of the device 200, and FIGS. 7B, 7C, and 7D illustrate cross-sectional views of the device 200, in portion, along the B-B line, the C-C line, and the D-D line in FIG. 7A, respectively. In the present embodiment, the source region of the transistor is exposed through the etch mask 241 (FIG. 6C), and the drain region of the transistor is covered by the etch mask 241 (FIG. 6D). In an alternative embodiment, the source region of the transistor is covered by the etch mask 241, and the drain region of the transistor is exposed through the etch mask 241. In some embodiments, both the source and drain regions of the same transistor may be exposed through the etch mask 241. For the convenience of discussion, the S/D trenches 250 that are exposed through the etch mask 241 are referred to as S/D trenches 250'. The etch mask 241 includes a patterned hard mask 236 and a patterned resist 237 in the present embodiment. The etch mask 241 may additionally include a bottom anti-reflective coating (BARC) layer between the patterned hard mask 236 and the patterned resist 237 in some embodiments. The patterned resist 237 may be formed using resist coating (for example, spin-on coating), soft baking, mask aligning, exposure, post-exposure baking, resist developing, rinsing, drying (for example, hard baking), other suitable lithography processes, or combinations thereof.

Figure 8A:
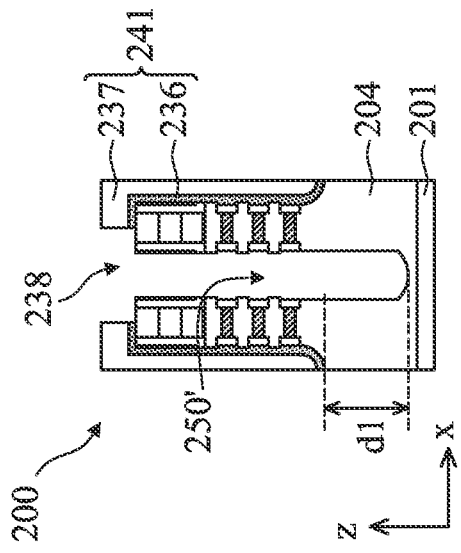
Figure 8B:
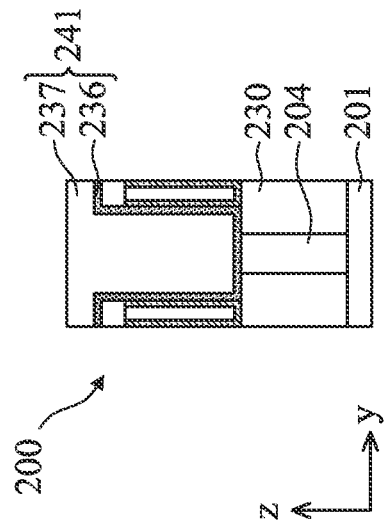
Figure 8C:
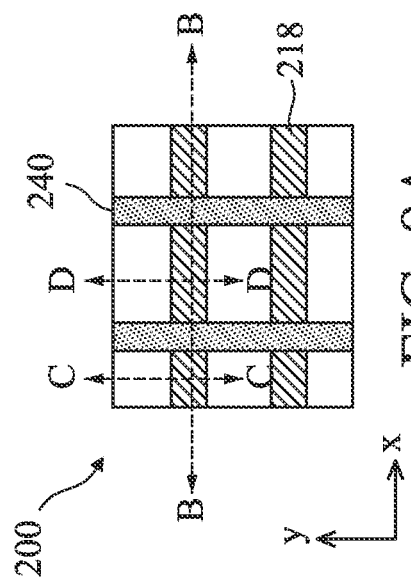
Figure 8D:
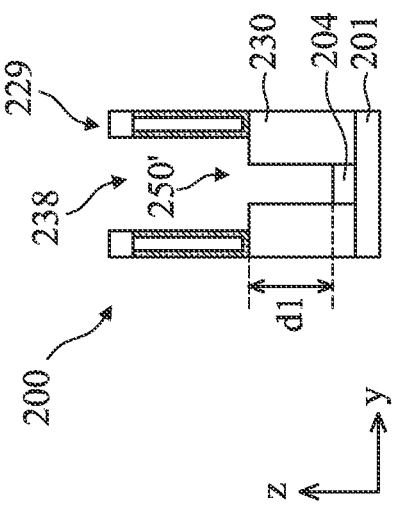

At operation 110, the method 100 (FIG. 1A) etches the S/D trenches 250' to extend them deeper. The resultant structure is shown in FIGS. 8A-8D. FIG. 8A illustrates a top view of the device 200, and FIGS. 8B, 8C, and 8D illustrate cross-sectional views of the device 200, in portion, along the B-B line, the C-C line, and the D-D line in FIG. 8A, respectively. The etching process may include dry etching, wet etching, reactive ion etching, or other suitable etching. The etching process is substantially anisotropic (i.e., substantially vertical) in this embodiment. Also, the etching process is tuned selective to the material of the semiconductor layer 204 and with no (or minimal) etching to the etch mask 241, the gate spacers 247, the dummy dielectric fins 229, the gate hard mask layers 246, the inner spacers 255, and the isolation structure 230. In some embodiments, the S/D trenches 250' are extended such that its bottom surface is below the top surface of the isolation structure 230 by a distance d1. In some embodiments, the distance dl may be in the range of about 30 nm to about 60 nm, such as from about 40 nm to about 50 nm, depending on the thickness of the semiconductor layer 204. Etching the S/D trenches 250' deeper allows the enlarged bottom portion of S/D features to be closer to the backside power rails. However, if the S/D trenches 250' are too deep, then lateral etching of the isolation structure 230 (see the operation 112 below) might be difficult in some instances. For example, it might become difficult to get the etchants into deep trenches and still control the etching profile. Therefore, the depth of the trenches 250' are controlled to be in the above range (such as having their bottom surfaces below the top surface of the isolation structure 230 by about 30 nm to about 60 nm).

Figure 9A:
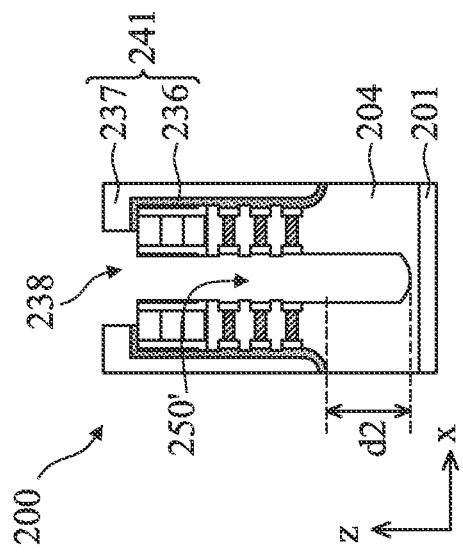
Figure 9B:
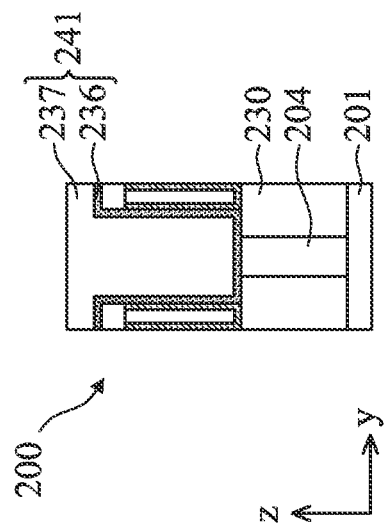
Figure 9C:
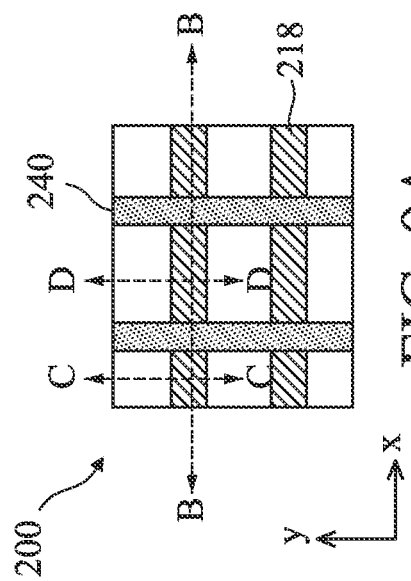
Figure 9D:
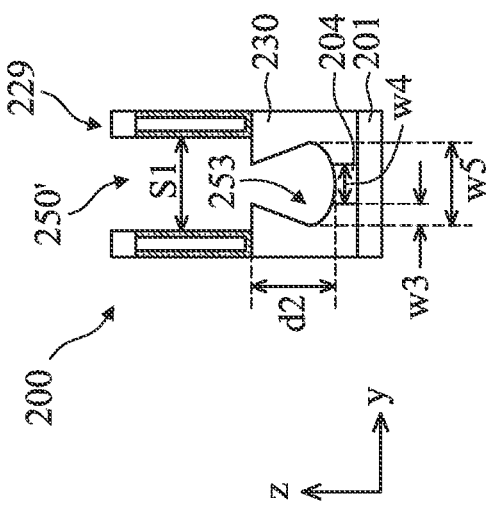

At operation 112, the method 100 (FIG. 1A) performs another etching to the S/D trenches 250' to particularly enlarge their bottom section that are surrounded by the isolation structure 230. The resultant structure is shown in FIGS. 9A-9D. FIG. 9A illustrates a top view of the device 200, and FIGS. 9B, 9C, and 9D illustrate cross-sectional views of the device 200, in portion, along the B-B line, the C-C line, and the D-D line in fig. 9A, respectively. The bottom section 253 of the S/D trenches 250' is enlarged to have a profile that widens and then narrows along the "z" direction. Prior to the operation 112, the bottom section of the S/D trenches 250' has a near vertical profile (see FIG. 8C) or a substantially trapezoidal profile (in either case, its sidewalls are linear) that becomes narrower as it goes up along the "z" direction. The etching process is tuned selective to the material of the isolation structure 230 and with no (or minimal) etching to the gate spacers 247, the dummy dielectric fins 229, the gate hard mask layers 246, the inner spacers 255, the channel layers 215, and the semiconductor layer 204. The etching process may include dry etching, wet etching, reactive ion etching, or other suitable etching in various embodiments. Particularly, the etching process includes an isotropic etching component that laterally etches the isolation structure 230. In an embodiment, the etching process uses a dry (plasma) etching with plasma generated from $NF_3$ and $NH_3$ gases or similar gases having fluorine, nitrogen, and hydrogen components. The operation 112 may tune the various etching parameters in order to control the profile of the bottom section 253 (such as the amount of the vertical extension and the lateral expansion). For example, it may tune $NH_3$ gas flow rate, the ratio of $NH_3$ gas flow rate to $NF_3$ gas flow rate, the etching time, the etching pressure, and so on. In an embodiment where a lateral expansion w3 of the S/D trenches 250' is desired to be in a range of 10 nm to 20 nm, the $NH_3$ gas flow rate may be tuned in a range of about 150 sccm to about 220 sccm, the ratio of $NH_3$ gas flow to $NF_3$ gas flow may be tuned in a range of 10 to 20, and the etching time may be in a range of about 20 seconds to about 40 seconds. In an embodiment, the S/D trenches 250' are expanded laterally (or sideways) by a distance w3 along the "y" direction into the isolation structure 230, as measured at the widest part of the S/D trenches 250' inside the isolation structure 230. In some embodiments, the distance w3 is in a range of about 5 nm to about 25 nm, such as in a range of about 10 nm to about 20 nm. If the distance w3 is too small (such as less than 5 nm), the effect of enlarging the S/D features may not be significant enough in some instances. If the distance w3 is too large (such as more than 30 nm), it runs the risk of totally breaking through the isolation structure 230 and shorting adjacent S/D features. Further, the operation 112 may extend the S/D trenches 250' deeper along the "z" direction. After the operation 112 finishes, the S/D trenches 250' extend below the top surface of the isolation structure 230 by a distance d2. In various embodiments, d2 is larger than d1. For example, d2 may be greater than dl by about 10 nm to about 40 nm, such as about 20 nm to about 30 nm. In some embodiments, the width of the semiconductor layer 204 right below the S/D trenches 250' has a width w4 along the "y" direction. The width w4 may be in a range about 30 nm to about 40 nm in some embodiments. In those embodiments, the bottom section 253 of the S/D trenches 250' have a total width w5 of about (w4+2×w3), which is in a range of 40 to 90 nm. The importance of this range is similar to what is discussed above with respect to the width w3. In some embodiments, the bottom section 253 of the S/D trenches 250' extend directly below one or both of the dielectric fins 229 to gain extra width. In other words, the width w5 is greater than the spacing S1 between the dielectric fins 229. In those embodiments, a via structure (such as the via 282 in FIG. 20C) have a greater width and a greater volume for even more reduced resistance.

Figure 10B:
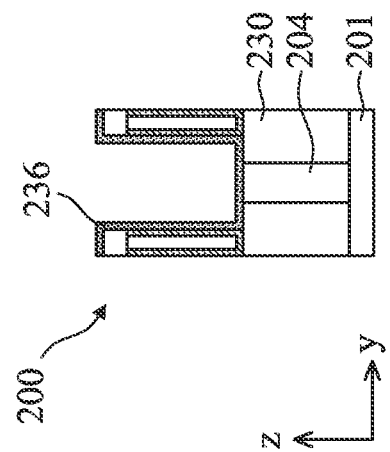
Figure 10A:
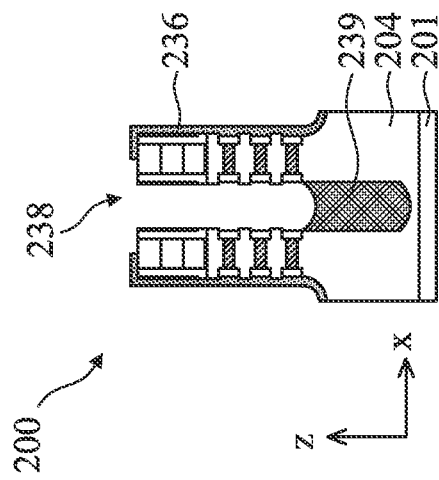
Figure 10D:
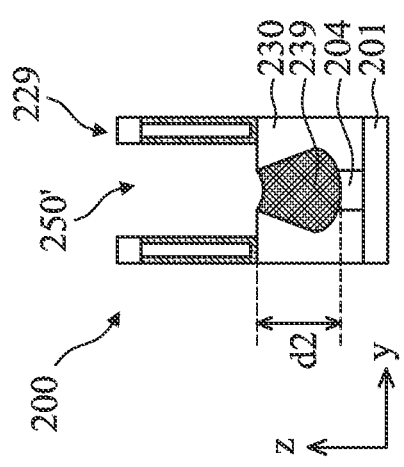
Figure 10C:
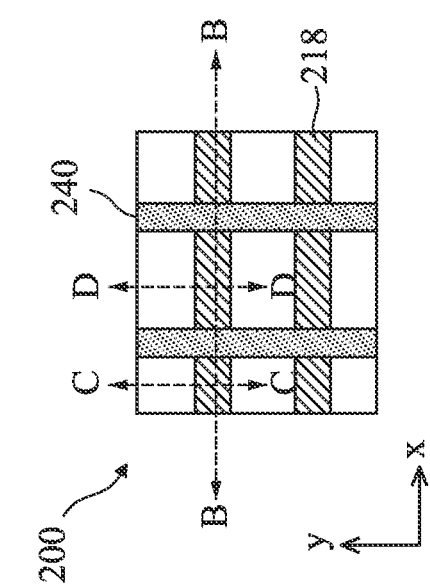

At operation 114, the method 100 (FIG. 1B) forms a semiconductor layer 239 in the source/drain trenches 250' after removing the patterned resist 237, for example, by stripping, ashing, or other methods. The resultant structure is shown in FIGS. 10A-10D according to an embodiment. FIG. 10A illustrates a top view of the device 200, and FIGS. 10B, 10C, and 10D illustrate cross-sectional views of the device 200, in portion, along the B-B line, the C-C line, and the D-D line in FIG. 10A, respectively. The semiconductor layer 239 may be deposited using an epitaxial growth process or by other suitable processes. In some embodiments, epitaxial growth of semiconductor layers 239 is achieved by a molecular beam epitaxy (MBE) process, a chemical vapor deposition (CVD) process, a metalorganic chemical vapor deposition (MOCVD) process, other suitable epitaxial growth process, or combinations thereof. The semiconductor layer 239 includes a semiconductor material that is different than the semiconductor material included in the semiconductor layer 204 to achieve etching selectivity during subsequent processing. For example, semiconductor layers 239 and 204 may include different materials, different constituent atomic percentages, different constituent weight percentages, and/or other characteristics to achieve desired etching selectivity during an etching process. In an embodiment, the semiconductor layer 204 includes silicon and the semiconductor layer 239 includes silicon germanium. In another embodiment, semiconductor layers 239 and 204 can both include silicon germanium, but with different silicon atomic percent. The present disclosure contemplates that semiconductor layers 239 and 204 include any combination of semiconductor materials that can provide desired etching selectivity, including any of the semiconductor materials disclosed herein. Since the drain regions (FIG. 10D) are covered by the patterned hard mask layer 236, the semiconductor layer 239 is only deposited in the source regions (FIG. 10C). The semiconductor layer 239 is deposited to a thickness such that it is near the bottom of the stack 205 (FIG. 10B) and is about level with the top surface of the isolation features 230 (FIG. 10C). The operation 114 may include an etching process that recesses the semiconductor layer 239 to the level shown in FIGS. 10B and 10C if the semiconductor layer 239 is initially grown taller than that. After the semiconductor layer 239 is deposited, the operation 114 removes the patterned hard mask layer 236 by one or more etching processes. As will be discussed below, the extra etching in the operations 110 and 112 and the growing of the semiconductor layer 239 in the operation 114 can be performed in source regions only, drain regions only, or both source and drain regions in various embodiments.

At operation 116, the method 100 (FIG. 1B) epitaxially grows semiconductor S/D features 260 in the S/D trenches 250 and epitaxially grows semiconductor S/D features 260' in the S/D trenches 250'. The resultant structure is shown in FIGS. 11A-11D according to an embodiment. FIG. 11A illustrates a top view of the device 200, and FIGS. 11B, 11C, and 11D illustrate cross-sectional views of the device 200, in portion, along the B-B line, the C-C line, and the D-D line in FIG. 11A, respectively.

As shown in FIGS. 11B, 11C, and 11D, epitaxial S/D features 260 are grown from the semiconductor layers 204 and from the semiconductor layers 215 at the S/D trenches 250, and epitaxial S/D features 260' are grown from the semiconductor layer 239 and from the semiconductor layers 215 at the S/D trenches 250'. An epitaxy process can use CVD deposition techniques (for example, VPE and/or UHV-CVD), molecular beam epitaxy, other suitable epitaxial growth processes, or combinations thereof. The epitaxy process can use gaseous and/or liquid precursors, which interact with the composition of the semiconductor layers 204, 239, and 215. Epitaxial S/D features 260/260' are doped with n-type dopants or p-type dopants for n-type transistors or p-type transistors respectively. In some embodiments, for n-type transistors, epitaxial S/D features 260/260' include silicon and can be doped with carbon, phosphorous, arsenic, other n-type dopant, or combinations thereof (for example, forming Si:C epitaxial source/drain features, Si:P epitaxial source/drain features, or Si:C:P epitaxial source/drain features). In some embodiments, for p-type transistors, epitaxial S/D features 260/260' include silicon germanium or germanium and can be doped with boron, other p-type dopant, or combinations thereof (for example, forming Si:Ge:B epitaxial source/drain features). In some embodiments, epitaxial S/D features 260/260' include more than one epitaxial semiconductor layer, where the epitaxial semiconductor layers can include the same or different materials and/or dopant concentrations. Further, in an embodiment, the S/D feature 260' (or at least its portion adjoining to the semiconductor layer 239) includes a different material composition than the semiconductor layer 239 to achieve etch selectivity during backside via formation process. For example, in an embodiment, the semiconductor layer 239 include SiGe and the S/D feature 260' includes Si (for n-type transistor). For example, in another embodiment, the semiconductor layer 239 include SiGe with a first Ge atomic percent and the S/D feature 260' includes SiGe (for p-type transistor) with a second Ge atomic percent and the first and the second Ge atomic percent are different. In some embodiments, epitaxial S/D features 260/260' include materials and/or dopants that achieve desired tensile stress and/or compressive stress in respective channel regions. In some embodiments, epitaxial source/drain features 260/260' are doped during deposition by adding impurities to a source material of the epitaxy process (i.e., in-situ). In some embodiments, epitaxial source/drain features 260/260' are doped by an ion implantation process subsequent to a deposition process. In some embodiments, annealing processes (e.g., rapid thermal annealing (RTA) and/or laser annealing) are performed to activate dopants in epitaxial source/drain features 260/260'. In some embodiments, epitaxial source/drain features 260/260' are formed in separate processing sequences that include, for example, masking p-type GAA transistor regions when forming epitaxial source/drain features 260/260' in n-type GAA transistor regions and masking n-type GAA transistor regions when forming epitaxial source/drain features 260/260' in p-type GAA transistor regions.

Further, as shown in FIGS. 11C and 11D, the S/D features 260/260' expand in the space between the dielectric fins 229. This expansion may be caused by different growth rates of different crystal facets. Referring to FIG. 11C, the S/D features 260' has a height H1 along the "z" direction and a width w1 along the "y" direction (as measured at the widest part of the S/D features 260'). In some embodiments, H1 may be in a range of about 40 nm to about 70 nm and w1 may be in a range of about 30 nm to about 60 nm. In some embodiments, a ratio of w1 to H1 may be in a range of about 0.4 to 1.5. Referring to FIG. 11D, the S/D features 260 has a height H6 along the "z" direction and a width w6 along the "y" direction (as measured at the widest part of the S/D features 260). In some embodiments, H6 may be in a range of about 40 nm to about 70 nm and w6 may be in a range of about 30 nm to about 60 nm. In some embodiments, a ratio of w6 to H6 may be in a range of about 0.4 to 1.5. The dimensions of the S/D features 260 and 260' may be about the same or different in various embodiments. The S/D features 260 and 260' provide landing areas for frontside S/D contacts in some instances. Therefore, they are grown to a sufficiently large volume to provide sufficient landing area. If the widths w1 and w6 and/or the heights H1 and H6 are too small (such as less than the lower limits of the ranges above), then the volume of the S/D features 260/260' may be too small, adversely affecting the transistor performance. In some embodiments, their widths are confined by the spacing between the dielectric fins 229, and their heights are controlled to be about the same as the height of the dielectric fins 229. Having such configuration helps minimize the risk of shorting adjacent S/D features. In various embodiments, the width w5 of the semiconductor layer 239 is greater than the width w1.

Still referring to FIG. 11D, the semiconductor layer 204 has a width w2 near the S/D feature 260 and has a height H2. In some embodiments, the width w2 is in a range of about 20 nm to about 40 nm, and the height H2 is in a range of about 14 nm to about 26 nm. In various embodiments, the ratio of w1 to w2 is in a range of 1 to 3, and the ratio of w6 to w2 is in a range of 1 to 3. As discussed above, it is generally desirable to have the S/D features 260/260' to be wide (for example, to reduce S/D resistance), therefore, w1 and w6 are greater than w2. However, the ratio of w1:w2 and w6:w2 cannot be too big. First, the upper limits of the width w1 and w6 are limited by the desire for increasing the device integration. Second, the width w2 cannot be too small. Otherwise, the backside S/D resistance might be too big or the backside dielectric filling process (to replace the semiconductor layer 204) may become difficult.

At operation 118, the method 100 (FIG. 1B) forms a contact etch stop layer (CESL) 269 and an inter-layer dielectric (ILD) layer 270. The resultant structure is shown in FIGS. 12A-12D according to an embodiment. FIG. 12A illustrates a top view of the device 200, and FIGS. 12B, 12C, and 12D illustrate cross-sectional views of the device 200, in portion, along the B-B line, the C-C line, and the D-D line in FIG. 12A, respectively.

As shown in FIGS. 12B-12D, the CESL 269 is deposited over the S/D features 260/260', and the ILD layer 270 is deposited over the CESL 269 and fills the space between opposing gate spacers 247. The CESL 269 includes a material that is different than ILD layer 270 and different than the dielectric layer 234. The CESL 269 may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s); and may be formed by CVD, PVD, ALD, or other suitable methods. The ILD layer 270 may comprise tetraethylorthosilicate (TEOS) oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or combinations thereof. The ILD 270 may be formed by PECVD (plasma enhanced CVD), FCVD (flowable CVD), or other suitable methods. Subsequent to the deposition of the CESL 269 and the ILD layer 270, a CMP process and/or other planarization process can be performed until reaching (exposing) a top portion (or top surface) of dummy gate stacks 240. In some embodiments, the planarization process removes hard mask layers 246 of dummy gate stacks 240 to expose underlying dummy gate electrodes 245, such as polysilicon gate electrode layers.

At operation 120, the method 100 (FIG. 1B) replaces the dummy gate stacks 240 with functional gate stack 240' (such as high-k metal gates). The resultant structure is shown in FIGS. 13A, 13B, and 13C according to an embodiment. FIG. 13A illustrates a top view of the device 200, and FIGS. 13B and 13C illustrate cross-sectional views of the device 200, in portion, along the B-B line and the C-C line in FIG. 13A, respectively. This involves a variety of processes as briefly described below.

First, the operation 120 removes the dummy gate stacks 240 (the dummy gate electrodes 245 and the dummy gate dielectric layer 235, see FIG. 4B) using one or more etching process. This forms a gate trench. The etching process may be a dry etching process, a wet etching process, other suitable etching process, or combinations thereof. In some embodiments, the etching process is a multi-step etch process. For example, the etching process may alternate etchants to separately remove various layers of dummy gate stacks 240. In some embodiments, the etching process is configured to selectively etch dummy gate stacks 240 with minimal (to no) etching of other features of the device 200, such as ILD layer 270, gate spacers 247, isolation features 230, cladding layer 231, semiconductor layers 215, and semiconductor layers 210.

Next, the operation 120 removes the cladding layer 231 exposed in the gate trench. The etching process may selectively etch the cladding layer 231 with minimal (to no) etching of semiconductor layers 215, gate spacers 247, and inner spacers 255.

Next, the operation 120 removes the semiconductor layers 210 exposed in the gate trench, leaving the semiconductor layers 215 suspended over the semiconductor layer 204 and connected with the S/D features 260/260'. This process is also referred to as a channel release process and the semiconductor layers 215 are also referred to as channel layers. The etching process selectively etches semiconductor layers 210 with minimal (to no) etching of semiconductor layers 215 and, in some embodiments, minimal (to no) etching of gate spacers 247 and/or inner spacers 255. In embodiments where the device 200 is a FinFET, the channel release process is omitted because there is only a channel layer 215 and there are no semiconductor layers 210 in the channel region.

Next, the operation 120 forms a gate dielectric layer 349 that wraps around each of the semiconductor layers 215 and forms a gate electrode 350 over the gate dielectric layer 349. The functional gate stack 240' comprises the gate dielectric layer 349 and the gate electrode 350. The gate dielectric layer 349 may include a high-k dielectric material such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide (k≈3.9). The gate dielectric layer 349 may be formed by chemical oxidation, thermal oxidation, atomic layer deposition (ALD), chemical vapor deposition (CVD), and/or other suitable methods. In some embodiments, the gate stack 240' further includes an interfacial layer between the gate dielectric layer 349 and the channel layers 215. The interfacial layer may include silicon dioxide, silicon oxynitride, or other suitable materials. In some embodiments, the gate electrode layer 350 includes an n-type or a p-type work function layer and a metal fill layer. For example, an n-type work function layer may comprise a metal with sufficiently low effective work function such as titanium, aluminum, tantalum carbide, tantalum carbide nitride, tantalum silicon nitride, or combinations thereof. For example, a p-type work function layer may comprise a metal with a sufficiently large effective work function, such as titanium nitride, tantalum nitride, ruthenium, molybdenum, tungsten, platinum, or combinations thereof. For example, a metal fill layer may include aluminum, tungsten, cobalt, copper, and/or other suitable materials. The gate electrode layer 350 may be formed by CVD, PVD, plating, and/or other suitable processes. Since the gate stack 240' includes a high-k dielectric layer and metal layer(s), it is also referred to as a high-k metal gate.

Figure 14B:
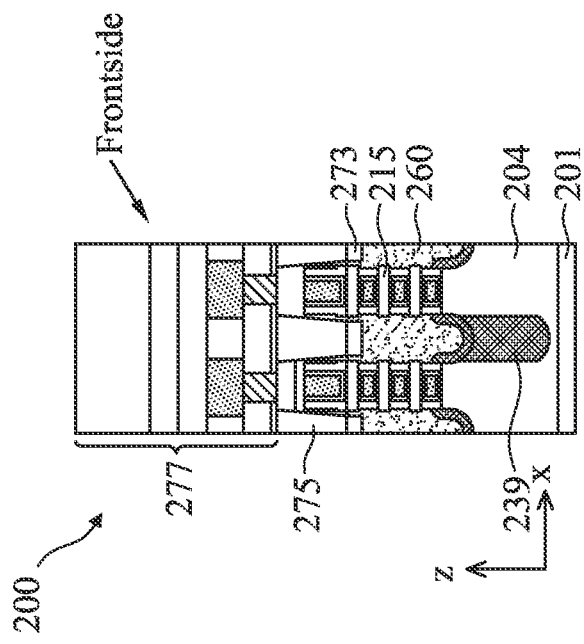
Figure 14D:
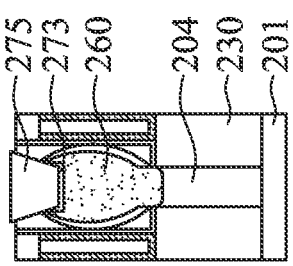
Figure 14A:
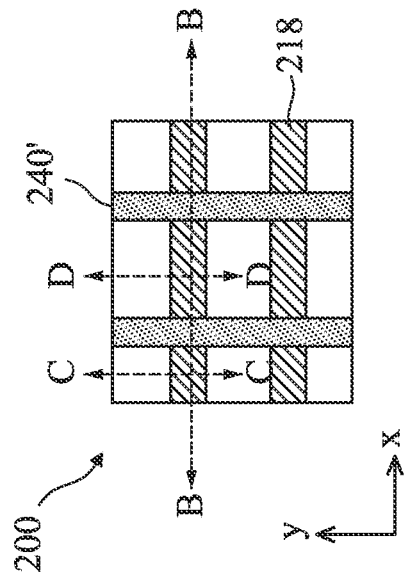
Figure 14C:
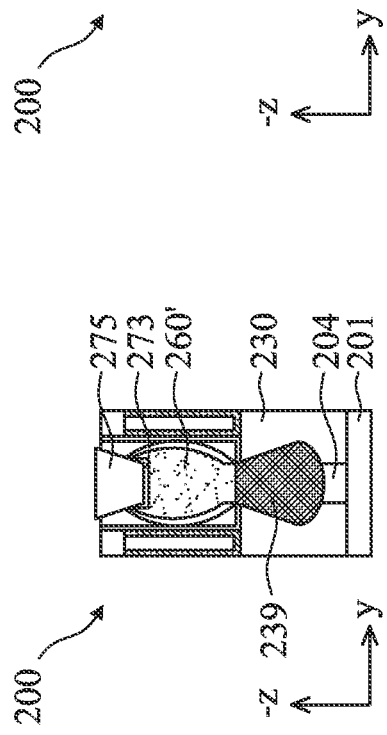

At operation 122, the method 100 (FIG. 1B) performs mid-end-of-line (MEOL) and back-end-of-line (BEOL) processes. The resultant structure is shown in FIGS. 14A-14D according to an embodiment. FIG. 14A illustrates a top view of the device 200, and FIGS. 14B, 14C, and 14D illustrate cross-sectional views of the device 200, in portion, along the B-B line, the C-C line, and the D-D line in FIG. 14A, respectively. For example, the operation 122 etches S/D contact holes to expose some of the S/D features 260/260'. The S/D features 260/260' may be partially etched in some embodiments. The etching processes can be dry etching, wet etching, reactive ion etching, or other etching methods. Then, the operation 122 forms silicide features 273 over the S/D features 260/260' and form S/D contacts (or vias) 275 over the silicide features 273. Since the silicide features 273 and the S/D contacts 275 are formed at the frontside of the device 200, they are also referred to as frontside silicide features 273 and frontside S/D contacts 275 respectively.

The silicide features 273 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds. In an embodiment, the S/D contacts 275 may include a conductive barrier layer and a metal fill layer over the conductive barrier layer. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), or other metals, and may be formed by CVD, PVD, ALD, plating, or other suitable processes. In some embodiments, the conductive barrier layer is omitted in the S/D contacts 275.

The operation 122 may also form gate vias connecting to the gate stacks 240', form S/D contact vias connecting to the S/D contacts 275, and form one or more interconnect layers with wires and vias embedded in dielectric layers. The one or more interconnect layers connecting gate, source, and drain electrodes of various transistors, as well as other circuits in the device 200, to form an integrated circuit in part or in whole. The operation 122 may also form passivation layer(s) over the interconnect layers. In the example shown in FIG. 14B, a layer 277 is used to denote various dielectric and metal layers including interconnect layers and passivation layers formed at the frontside of the device 200 over the S/D contacts 275.

Figure 15B:
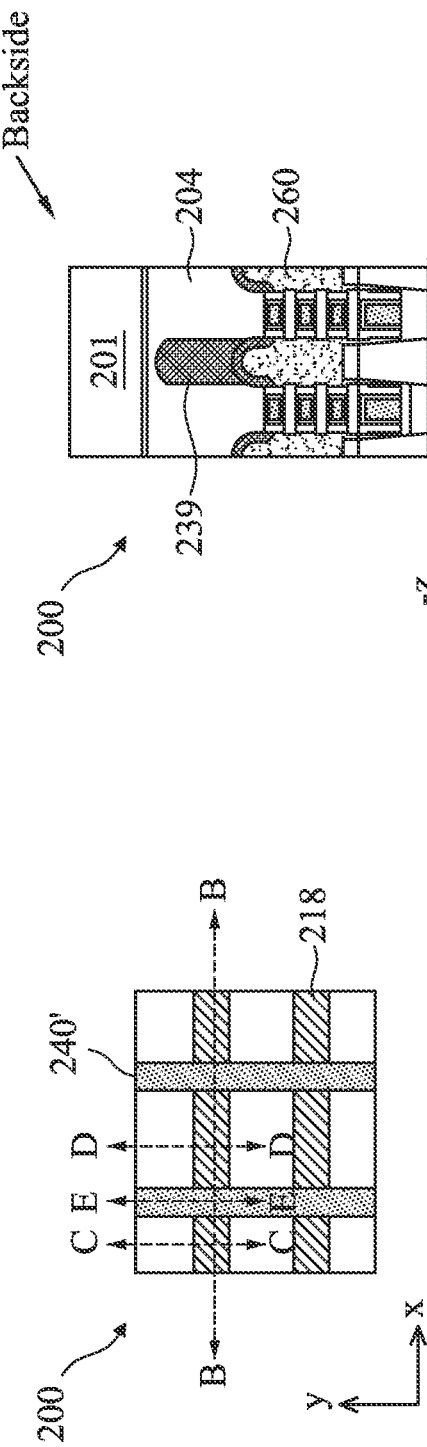
Figure 15A:
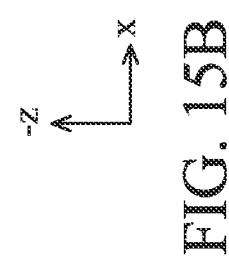
Figure 15E:
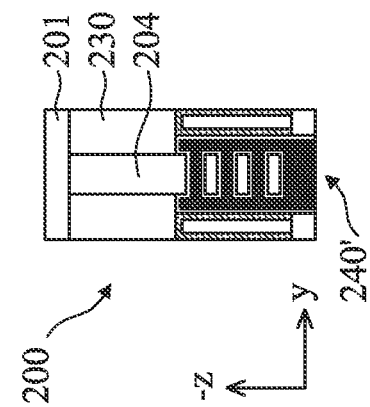
Figure 15D:
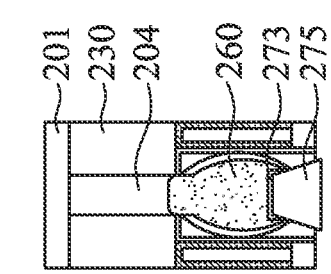
Figure 15C:
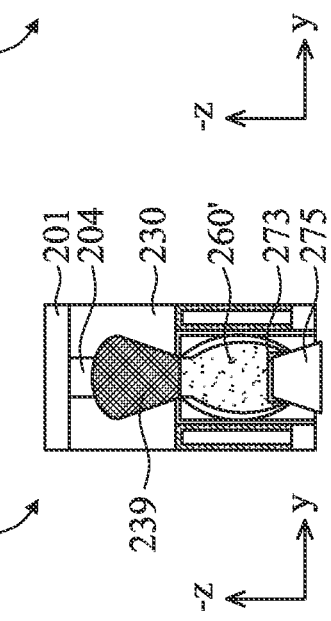

At operation 124, the method 100 (FIG. 1C) flips the device 200 upside down and attaches the frontside of the device 200 to a carrier 370, such as shown in FIG. 15B. FIG. 15A illustrates a top view of the device 200, and FIGS. 15B, 15C, 15D, and 15E illustrate cross-sectional views of the device 200, in portion, along the B-B line, the C-C line, the D-D line, and the E-E line in FIG. 15A, respectively. This makes the device 200 accessible from the backside of the device 200 for further processing. The operation 124 may use any suitable attaching processes, such as direct bonding, hybrid bonding, using adhesive, or other bonding methods. The operation 124 may further include alignment, annealing, and/or other processes. The carrier 370 may be a silicon wafer in some embodiment. In FIGS. 15B-15E (as well as in other figures to be described below), the "z" direction points from the backside of the device 200 to the frontside of the device 200, while the "–z" direction points from the frontside of the device 200 to the backside of the device 200.

Figure 16A:
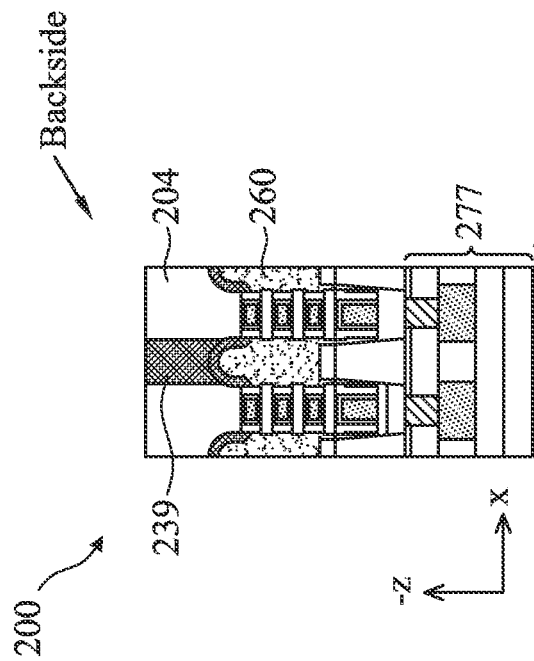
Figure 16B:
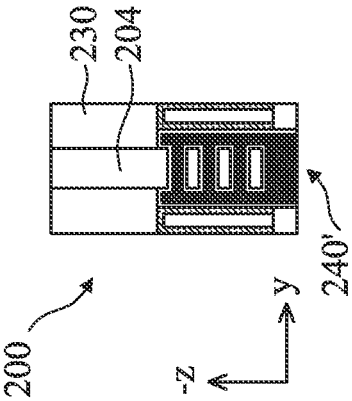
Figure 16C:
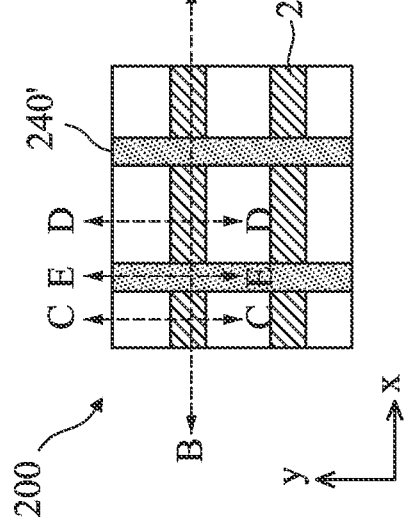
Figure 16D:
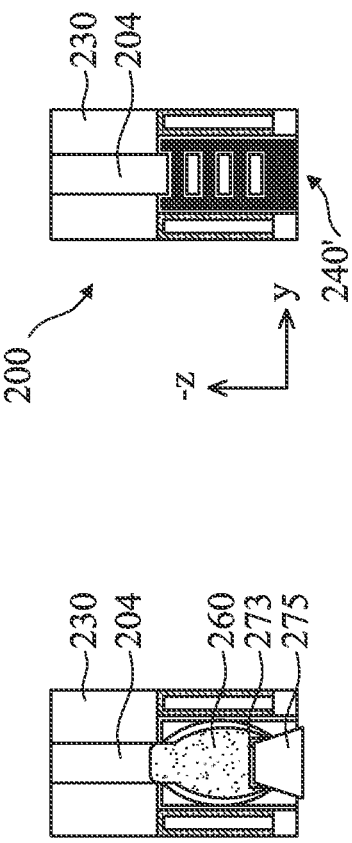
Figure 16E:
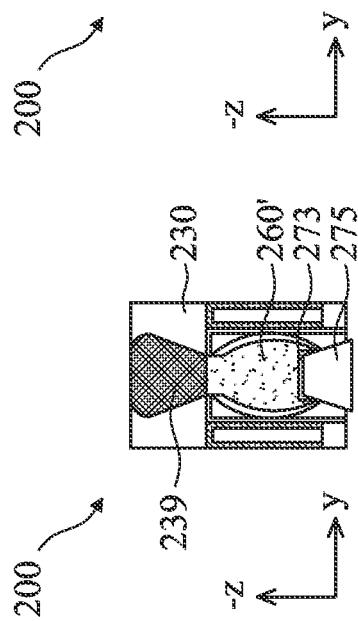

At operation 126, the method 100 (FIG. 1C) thins down the device 200 from the backside of the device 200 until the semiconductor layer 204, the semiconductor layer 239, and the isolation features 230 are exposed from the backside of the device 200. The resultant structure is shown in FIGS. 16A-16E according to an embodiment. FIG. 16A illustrates a top view of the device 200, and FIGS. 16B, 16C, 16D, and 16E illustrate cross-sectional views of the device 200, in portion, along the B-B line, the C-C line, the D-D line, and the E-E line in FIG. 16A, respectively. The thinning process may include a mechanical grinding process and/or a chemical thinning process. A substantial amount of substrate material may be first removed from the substrate 201 during a mechanical grinding process. Afterwards, a chemical thinning process may apply an etching chemical to the backside of the substrate 201 to further thin down the substrate 201.

At operation 128, the method 100 (FIG. 1C) selectively etches the semiconductor layer 204 (and part of the fins 218) to form trenches 272 over the backside of the gate stacks 240' and the S/D features 260/260'. The resultant structure is shown in FIGS. 17A-17E according to an embodiment. FIG. 17A illustrates a top view of the device 200, and FIGS. 17B, 17C, 17D, and 17E illustrate cross-sectional views of the device 200, in portion, along the B-B line, the C-C line, the D-D line, the E-E line in FIG. 17A, respectively. In the present embodiment, the operation 128 applies an etching process that is tuned to be selective to the materials of the semiconductor layer 204 and with no (or minimal) etching to the semiconductor layer 239, the S/D features 260, the gate stacks 240', and the isolation features 230. The etching process can be dry etching, wet etching, reactive ion etching, or other etching methods.

At operation 130, the method 100 (FIG. 1C) forms one of more dielectric layers to fill the trenches 272. For example, the one of more dielectric layers may include a dielectric liner 274 and one or more dielectric layers 276. The resultant structure is shown in FIGS. 18A-18E according to an embodiment. FIG. 18A illustrates a top view of the device 200, and FIGS. 18B, 18C, 18D, and 18E illustrate cross-sectional views of the device 200, in portion, along the B-B line, the C-C line, the D-D line, and the E-E line in FIG. 18A, respectively. In some embodiments, the dielectric liner 274 may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s); and may be formed by CVD, PVD, ALD, or other suitable methods. In some embodiments, the dielectric layer(s) 276 may comprise tetraethylorthosilicate (TEOS) oxide, un-doped silicate glass, or doped silicon oxide such as borophosphosilicate glass (BPSG), fluoride-doped silica glass (FSG), phosphosilicate glass (PSG), boron doped silicon glass (BSG), and/or other suitable dielectric materials. The dielectric layer(s) 276 may be formed by PECVD (plasma enhanced CVD), FCVD (flowable CVD), or other suitable methods.

At operation 132, the method 100 (FIG. 1C) removes the semiconductor layer 239 from the backside of the device 200. The resultant structure is shown in FIGS. 19A-19E according to an embodiment. FIG. 19A illustrates a top view of the device 200, and FIGS. 19B, 19C, 19D, and 19E illustrate cross-sectional views of the device 200, in portion, along the B-B line, the C-C line, the D-D line, and the E-E line in FIG. 19A, respectively. In the present embodiment, the operation 132 applies an etching process that is tuned to be selective to the materials of the semiconductor layer 239 (such as SiGe in an embodiment) and with no (or minimal) etching to the dielectric liner 274, the dielectric layer(s) 276, and the isolation features 230. The etching process may not etch the source feature 260' in some embodiment and may partially etch the source feature 260' in some alternative embodiment. The etching process results in a trench 278 that exposes the source feature 260' from the backside of the device 200. The etching process can be dry etching, wet etching, reactive ion etching, or other etching methods. Particularly, in the present embodiment, the etching of the semiconductor layer 239 is self-aligned. In other words, the operation 132 does not need to make an etch mask (e.g., an etch mask formed by photolithography processes) in order to etch the semiconductor layer 239. Rather, it relies on the etch selectivity of the materials in the semiconductor layer 239 and its surrounding layers. This beneficially forms the trenches 278 to be aligned with the underlying source feature 260' without misalignments such as those introduced by photolithography overlay shift. Using this process will result in a backside source contact (or source via) that is ideally aligned with the source feature 260', as will be discussed below. Further, since the semiconductor layer 239 has an expanded profile, the trench 278 also has an expanded profile, which make it easier to fill metal material(s) when forming silicide features and via structures therein.

At operation 134, the method 100 (FIG. 1C) forms a backside source silicide feature 280 and a backside contact (or via or metal plug) 282 in the trench (or via hole) 278. The resultant structure is shown in FIGS. 20A-20E according to an embodiment. FIG. 20A illustrates a top view of the device 200, and FIGS. 20B, 20C, 20D, and 20E illustrate cross-sectional views of the device 200, in portion, along the B-B line, the C-C line, the D-D line, and the E-E line in FIG. 20A, respectively.

In an embodiment, the operation 134 deposits one or more metals into the via hole 278, performing an annealing process to the device 200 to cause reaction between the one or more metals and the S/D features 260' to produce the silicide features 280, and removing un-reacted portions of the one or more metals, leaving the silicide features 280 in the via hole. The one or more metals may include titanium (Ti), tantalum (Ta), tungsten (W), nickel (Ni), platinum (Pt), ytterbium (Yb), iridium (Ir), erbium (Er), cobalt (Co), or a combination thereof (e.g., an alloy of two or more metals) and may be deposited using CVD, PVD, ALD, or other suitable methods. The silicide feature 280 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds.

Then, the operation 134 deposits the via 282 in the via hole 278 and contacting the silicide feature 280. In an embodiment, the via 282 may include a conductive barrier layer and a metal fill layer over the conductive barrier layer. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), or other metals, and may be formed by CVD, PVD, ALD, plating, or other suitable processes. Because of the expanded profile of the via hole 278, the silicide feature 280 and the via 282 have an enlarged volume, beneficially reducing the contact resistance thereof. In an embodiment where the thinning of the backside of the structure 200 does not recess the semiconductor layer 239 below its widest part, the via 282 has a profile that widens and then narrows along the "z" direction such as shown in FIG. 20C. In such embodiment, the via 282 has a width w5 (as discussed with reference to FIG. 9C earlier) that is greater than the width w1 of the source feature 260'. In some embodiment where the thinning of the backside of the structure 200 recesses the semiconductor layer 239 below its widest part, the via 282 has a profile that generally narrows along the "z" direction (not shown). Even in these embodiments, the via 282 may be wider than the source feature 260' along the "y" direction. In various embodiments, the via 282 may extend laterally directly above the dielectric fins 229 along the "-z" direction. In other words, the via 282 may extend laterally directly below the dielectric fins 229 along the "z" direction. Such profile provides a large volume in the via 282. In the present embodiment, the via 282 has a near vertical profile in the x-z plane such as shown in FIG. 20B. For example, the sidewalls of the via 282 may be within +/−10 degrees from the vertical direction. In some embodiments, the via 282 has a generally trapezoidal profile in the x-z plane (not shown) where it generally narrows along the "z" direction.

At operation 136, the method 100 (FIG. 1C) performs further fabrications to the device 200. For example, the operation 136 forms backside power rails 284 and a backside interconnect 286. The resultant structure is shown in FIGS. 21A-21B according to an embodiment. FIG. 21A illustrates a top view of the device 200, and FIG. 21B illustrates a cross-sectional view of the device 200, in portion, along the B-B line in FIG. 21A. As illustrated in FIG. 21B, the backside via 282 is electrically connected to the backside power rails 284. In an embodiment, the backside power rails 284 may be formed using a damascene process, a dual-damascene process, a metal patterning process, or other suitable processes. The backside power rails 284 may include tungsten (W), cobalt (Co), molybdenum (Mo), ruthenium (Ru), copper (Cu), aluminum (Al), titanium (Ti), tantalum (Ta), or other metals, and may be deposited by CVD, PVD, ALD, plating, or other suitable processes. Although not shown in FIG. 21B, the backside power rails 284 are embedded in one or more dielectric layers, and the backside interconnect 286 includes wires and vias embedded in one or more dielectric layers. In some embodiment, the backside power rails 284 are considered part of the backside interconnect 286. Having backside power rails 284 beneficially increases the number of metal tracks available in the device 200 for directly connecting to source/drain contacts and vias. It also increases the gate density for greater device integration than other structures without the backside power rails 284. The backside power rails 284 may have wider dimension than the first level metal (M0) tracks on the frontside of the device 200, which beneficially reduces the backside power rail resistance.

In the above embodiments, the source feature 260 is formed with both frontside and backside silicide features and with frontside and backside contacts, while the drain feature 260 is formed with a frontside silicide feature and a frontside contact and is isolated from backside power rails. In an alternative embodiment, the drain feature 260 may be formed with both frontside and backside silicide features and with frontside and backside contacts, while the source feature 260 is formed with a frontside silicide feature and a frontside contact and is isolated from backside power rails. This may be achieved by switching the processes that are specifically applied to the source region with those that are specifically applied to the drain region in the above embodiment. In another alternative embodiment, both the source feature 260 and the drain feature 260 may be formed with both frontside and backside silicide features and with frontside and backside contacts. This may be achieved by applying the processes that are specifically applied to the source region in the above embodiment to both the source region and the drain region.

Although not intended to be limiting, embodiments of the present disclosure provide one or more of the following advantages. For example, embodiments of the present disclosure form backside vias with enlarged profile, which advantageously reduces source/drain contact resistance on the backside. Embodiments of the present disclosure can be readily integrated into existing semiconductor manufacturing processes.

In one example aspect, the present disclosure is directed to a semiconductor structure. The semiconductor structure includes an isolation structure; first and second source/drain (S/D) features over the isolation structure, defining a first direction from the first S/D feature to the second S/D feature from a top view; one or more channel layers connecting the first and the second S/D features; a gate structure between the first and the second S/D features and engaging each of the one or more channel layers; and a via structure under the first S/D feature and electrically connecting to the first S/D feature. In a cross-sectional view perpendicular to the first direction, the via structure has a profile that widens and then narrows along a bottom-up direction.

In an embodiment, the semiconductor structure further includes a S/D contact disposed over and connecting to the first S/D feature. In another embodiment, the semiconductor structure further includes a silicide feature between the first S/D feature and the via structure. In yet another embodiment, the semiconductor structure further includes a dielectric feature directly under the second S/D feature and contacting the second S/D feature. In a further embodiment, the semiconductor structure includes a S/D contact over the second S/D feature and electrically connecting to the second S/D feature.

In an embodiment, the semiconductor structure further includes two dielectric fins adjacent to sidewalls of the first S/D feature. In a further embodiment, the via structure extends directly below at least one of the dielectric fins. In another embodiment, the one or more channel layers include a stack of semiconductor layers, and the gate structure wraps around each of the stack of semiconductor layers. In yet another embodiment, the via structure is wider than the first S/D feature in the cross-sectional view.

In another example aspect, the present disclosure is directed to a method that includes providing a structure having a substrate, an isolation structure over the substrate, a fin extending from the substrate and adjacent to the isolation structure, a sacrificial gate structure disposed over a channel region of the fin, and gate spacers on opposing sidewalls of the sacrificial gate structure. The method further includes first etching the fin adjacent the gate spacers to form a first source/drain (S/D) trench on one side of the sacrificial gate structure and a second S/D trench on another side of the sacrificial gate structure; forming an etch mask that exposes the first S/D trench and covers the second S/D trench; second etching the fin through the etch mask to deepen the first S/D trench; and laterally etching a portion of the isolation structure that is exposed at a lower section of the first S/D trench, resulting in an expanded lower section of the first S/D trench.

In an embodiment, after the laterally etching, the method further includes epitaxially growing a first semiconductor layer in at least the expanded lower section of the first S/D trench. In a further embodiment, the method includes epitaxially growing a first semiconductor S/D feature over the first semiconductor layer. The method may include forming a contact feature over the first semiconductor S/D feature. In a further embodiment where the isolation structure is disposed over a frontside of the substrate, the method includes thinning down the substrate from a backside of the substrate opposite to the frontside, thereby exposing the first semiconductor layer and the fin from the backside. The method may further include etching the first semiconductor layer from the backside to expose the first semiconductor S/D feature, resulting in a via hole and forming a metal plug in the via hole. The method may further include forming a metal track on the backside, the metal track electrically connecting to the metal plug.

In yet another example aspect, the present disclosure is directed to a method that includes providing a structure having a substrate, an isolation structure over the substrate, a fin extending from the substrate and adjacent to the isolation structure, a sacrificial gate structure disposed over a channel region of the fin, and gate spacers on opposing sidewalls of the sacrificial gate structure. The method further includes first etching the fin adjacent the gate spacers to form a first source/drain (S/D) trench on one side of the sacrificial gate structure and a second S/D trench on another side of the sacrificial gate structure; forming an etch mask that exposes the first S/D trench and covers the second S/D trench; and second etching the fin through the etch mask to deepen the first S/D trench. After the second etching, the method further includes laterally etching a portion of the isolation structure that is exposed at a lower section of the first S/D trench, resulting in an expanded lower section of the first S/D trench. The method further includes growing a first semiconductor layer in at least the expanded lower section of the first S/D trench wherein the first semiconductor layer includes a different material than the fin and epitaxially growing a first semiconductor S/D feature over the first semiconductor layer.

In an embodiment, the method further includes replacing the sacrificial gate structure with a high-k metal gate. In a further embodiment, the method includes forming a S/D contact over the first semiconductor S/D feature. In a further embodiment where the isolation structure is disposed over a frontside of the substrate, the method further includes thinning down the substrate from a backside of the substrate opposite to the frontside, thereby exposing the first semiconductor layer and the fin from the backside; removing the fin to form trenches; depositing one or more dielectric materials in the trenches; etching the first semiconductor layer to form a via hole; and forming a metal plug in the via hole.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
providing a structure having a substrate, an isolation structure over the substrate, a fin extending from the substrate and adjacent to the isolation structure, a sacrificial gate structure disposed over a channel region of the fin, and gate spacers on opposing sidewalls of the sacrificial gate structure;

first etching the fin adjacent the gate spacers to form a first source/drain (S/D) trench on one side of the sacrificial gate structure and a second S/D trench on another side of the sacrificial gate structure;

forming an etch mask that exposes the first S/D trench and covers the second S/D trench;

second etching the fin through the etch mask to deepen the first S/D trench; and after the second etching, laterally etching a portion of the isolation structure that is exposed at a lower section of the first S/D trench, resulting in an expanded lower section of the first S/D trench, wherein the laterally etching is tuned selective to a material of the isolation structure and not to a material of the fin.

2. The method of claim 1, further comprising:
after the laterally etching, epitaxially growing a first semiconductor layer in at least the expanded lower section of the first S/D trench.

3. The method of claim 2, further comprising:
epitaxially growing a first semiconductor S/D feature over the first semiconductor layer.

4. The method of claim 3, wherein the isolation structure is disposed over a frontside of the substrate, further comprising:
thinning down the substrate from a backside of the substrate opposite to the frontside, thereby exposing the first semiconductor layer and the fin from the backside.

5. The method of claim 4, further comprising:
etching the first semiconductor layer from the backside to expose the first semiconductor S/D feature, resulting in a via hole; and
forming a metal plug in the via hole.

6. The method of claim 5, further comprising:
forming a metal track on the backside, the metal track electrically connecting to the metal plug.

7. The method of claim 1, wherein the expanded lower section of the first S/D trench is narrower at an upper portion than at a lower portion.

8. The method of claim 1, wherein the fin includes a stack of second and third semiconductor layers, further comprising:
before the forming of the etch mask, recessing the second semiconductor layers within at least the first S/D trench to form gaps, and forming an inner dielectric spacer in the gaps.

9. A method comprising:
providing a structure having a substrate, an isolation structure over the substrate, a fin extending from the substrate and adjacent to the isolation structure, a sacrificial gate structure disposed over a channel region of the fin, and gate spacers on opposing sidewalls of the sacrificial gate structure, wherein the fin includes a stack of second and third semiconductor layers;

first etching the fin adjacent the gate spacers to form a first source/drain (S/D) trench on one side of the sacrificial gate structure and a second S/D trench on another side of the sacrificial gate structure;

recessing the second semiconductor layers within at least the first S/D trench to form gaps;

forming an inner dielectric spacer in the gaps;

after the forming of the inner dielectric spacer, forming an etch mask that exposes the first S/D trench and covers the second S/D trench;

second etching the fin through the etch mask to deepen the first S/D trench;

after the second etching, laterally etching a portion of the isolation structure that is exposed at a lower section of the first S/D trench, resulting in an expanded lower section of the first S/D trench;

growing a first semiconductor layer in at least the expanded lower section of the first S/D trench, wherein the first semiconductor layer includes a different material than the fin; and epitaxially growing a first semiconductor S/D feature over the first semiconductor layer.

10. The method of claim 9, further comprising:
replacing the sacrificial gate structure with a high-k metal gate.

11. The method of claim 10, further comprising:
forming a S/D contact over the first semiconductor S/D feature.

12. The method of claim 11, wherein the isolation structure is disposed over a frontside of the substrate, further comprising:
thinning down the substrate from a backside of the substrate opposite to the frontside, thereby exposing the first semiconductor layer and the fin from the backside;
removing the fin to form second trenches;
depositing one or more dielectric materials in the second trenches;
etching the first semiconductor layer to form a via hole; and
forming a metal plug in the via hole.

13. The method of claim 12, wherein the metal plug has a profile that widens and then narrows along a vertical direction.

14. A method comprising:
providing a structure having a substrate, an isolation structure over the substrate, a fin extending from the substrate and adjacent to the isolation structure, a sacrificial gate structure disposed over a channel region of the fin, and gate spacers on opposing sidewalls of the sacrificial gate structure, wherein the fin includes a stack of first and second semiconductor layers;

first etching the fin adjacent the gate spacers to form a first source/drain (S/D) trench on one side of the sacrificial gate structure and a second S/D trench on another side of the sacrificial gate structure;

recessing the first semiconductor layers within at least the first S/D trench to form gaps;

forming an inner dielectric spacer in the gaps;

forming an etch mask that exposes the first S/D trench and covers the second S/D trench;

second etching the fin through the etch mask to deepen the first S/D trench;

after the second etching, laterally etching a portion of the isolation structure that is exposed at a lower section of the first S/D trench, resulting in an expanded lower section of the first S/D trench; and growing a third semiconductor layer in at least the expanded lower section of the first S/D trench.

15. The method of claim 14, further comprising:
epitaxially growing a semiconductor S/D feature over the third semiconductor layer.

16. The method of claim 15, further comprising:
replacing the sacrificial gate structure with a functional gate.

17. The method of claim 15, further comprising:
thinning down the substrate from a backside of the substrate opposite to a side where the sacrificial gate structure is disposed, thereby exposing the third semiconductor layer and the fin from the backside;
selectively etching the fin to form second trenches; and depositing one or more dielectric materials in the second trenches that partly surround the third semiconductor layer.

18. The method of claim 17, further comprising:

selectively etching the third semiconductor layer to form a via hole that is partly surrounded by the one or more dielectric materials, thereby exposing the semiconductor S/D feature.

19. The method of claim 18, further comprising:

forming a silicide layer over the semiconductor S/D feature and in the via hole.

20. The method of claim 18, further comprising:

forming a metal plug in the via hole; and forming a power rail on the metal plug and electrically connected to the metal plug.

* * * * *